United States Patent [19]

Ohshima et al.

[11] Patent Number: 5,019,527
[45] Date of Patent: May 28, 1991

[54] METHOD OF MANUFACTURING NON-VOLATILE SEMICONDUCTOR MEMORIES, IN WHICH SELECTIVE REMOVAL OF FIELD OXIDATION FILM FOR FORMING SOURCE REGION AND SELF-ADJUSTED TREATMENT FOR FORMING CONTACT PORTION ARE SIMULTANEOUSLY PERFORMED

[75] Inventors: Yoichi Ohshima, Yokohama; Seiichi Mori, Tokyo, both of Japan

[73] Assignee: Kabushiki Kaisha Toshiba, Kawasaki, Japan

[21] Appl. No.: 564,768

[22] Filed: Aug. 9, 1990

[30] Foreign Application Priority Data

Aug. 11, 1989 [JP] Japan .................................. 1-208806

[51] Int. Cl.$^5$ .......................................... H01L 21/265
[52] U.S. Cl. .......................................... 437/43; 437/44; 437/49; 437/195
[58] Field of Search .................. 437/43, 44, 195, 49, 437/52, 984; 357/23.5

[56] References Cited

U.S. PATENT DOCUMENTS

| 4,637,128 | 1/1987 | Mizutani | 437/43 |
| 4,728,617 | 3/1988 | Woo et al. | 437/44 |
| 4,851,365 | 7/1989 | Jeuch | 437/43 |
| 4,868,138 | 9/1989 | Chan et al. | 437/195 |

FOREIGN PATENT DOCUMENTS

| 56-45068 | 4/1981 | Japan . | |
| 0251761 | 1/1989 | Japan . | |
| 0037852 | 2/1989 | Japan | 437/44 |

*Primary Examiner*—Brian E. Hearn
*Assistant Examiner*—Chandra Chaudhari
*Attorney, Agent, or Firm*—Banner, Birch, McKie & Beckett

[57] ABSTRACT

There is formed on a surface of a first conductivity type semiconductor substrate strip shaped first insulator separately extending in parallel with one another. A plurality of stacked gate structures, each comprising a second insulator, a floating gate, a third insulator, a control gate, a fourth insulator and an etching stopper having a slower etching speed than the fourth insulator, are formed on the substrate and the first insulator. Those portions of each first insulator that are located between the parallel extending gate structures and are present at prospective source regions are self-aligningly removed with using one end side of each gate structure as a part of a mask, so as to expose those portions of the substrate that are located at the prospective source regions. Impurities of a second conductivity type are self-aligningly introduced into each prospective source region with using one end side of each gate structure as a part of a mask to form a fifth insulator on a side wall of each gate structure. Impurities of the second conductivity type are self-aligningly introduced into each of prospective drain regions with using a drain side end of each gate structure as a part of a mask. Conductive layers are formed to contact with surfaces of the exposed drain regions and cover at least those parts of the fifth insulator that are laid on the walls at the drain regions of any two adjacent gate structures with corresponding one of the exposed drain regions between them. Sixth insulator is deposited on the resultant structure and are selectively removed with using the conductive layers as stoppers to make contact holes.

12 Claims, 23 Drawing Sheets

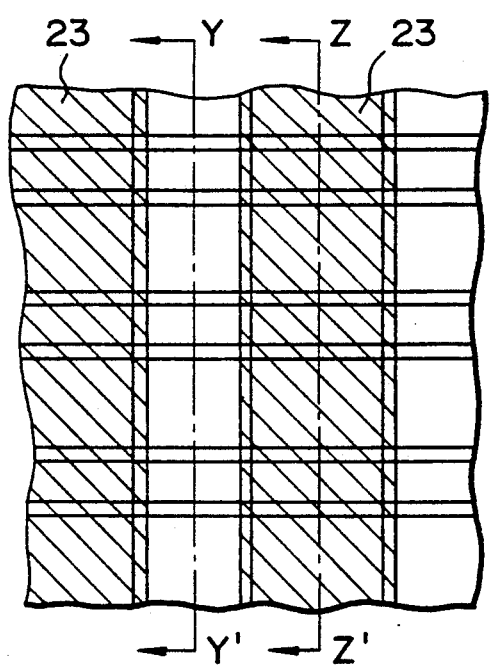
F I G. 31

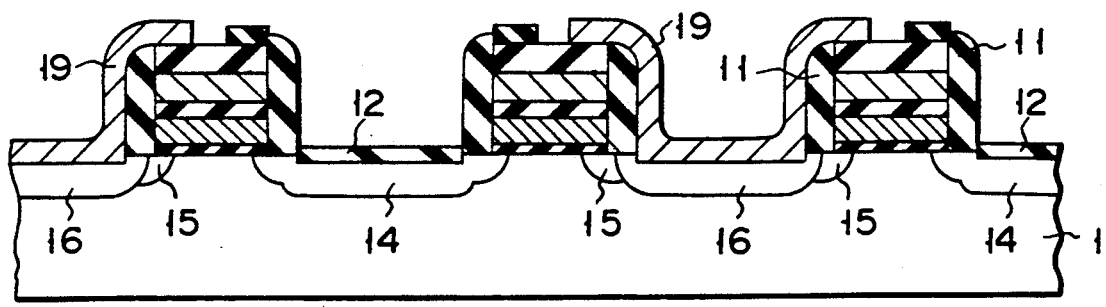
F I G. 4G
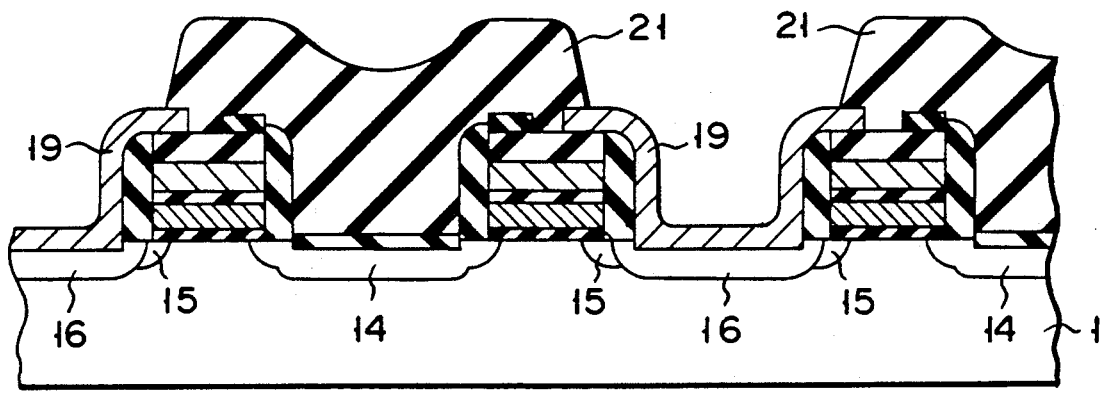
F I G. 4H
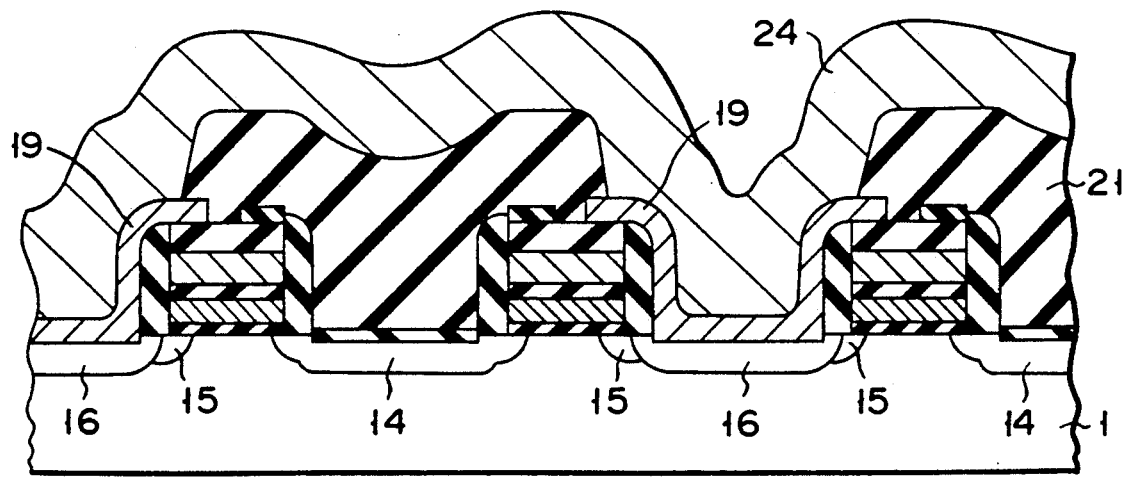
F I G. 4I

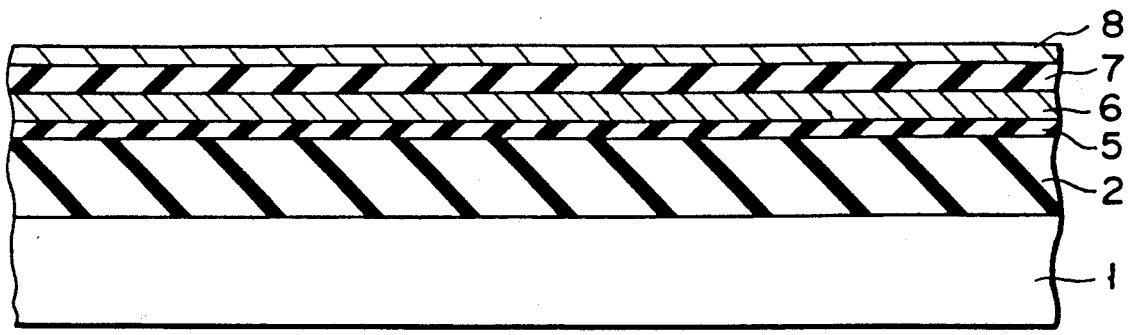
F I G. 5A
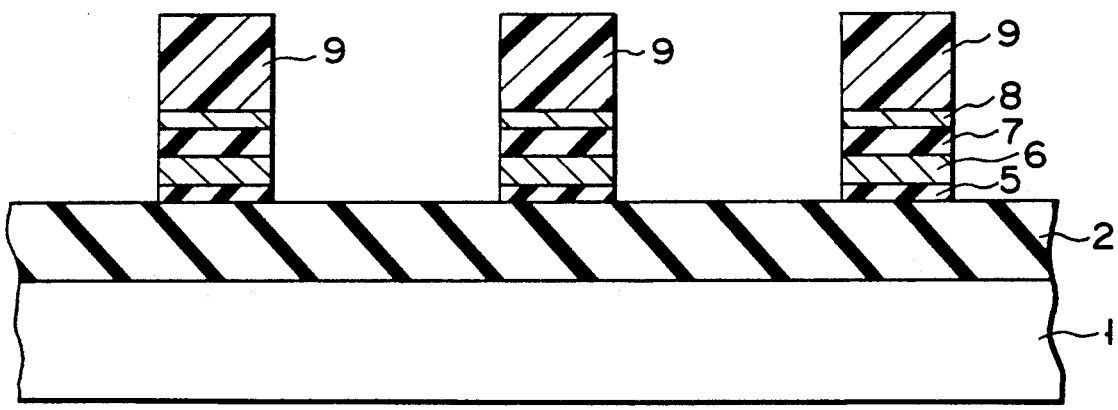
F I G. 5B
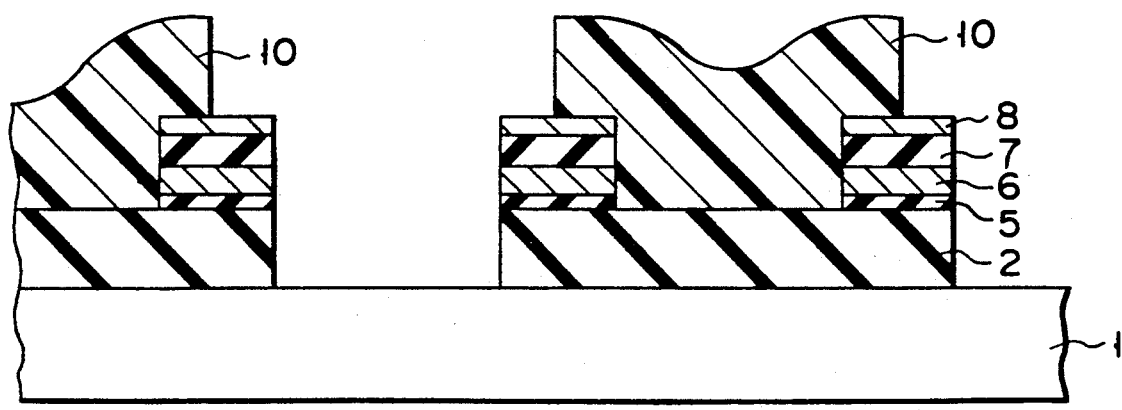
F I G. 5C

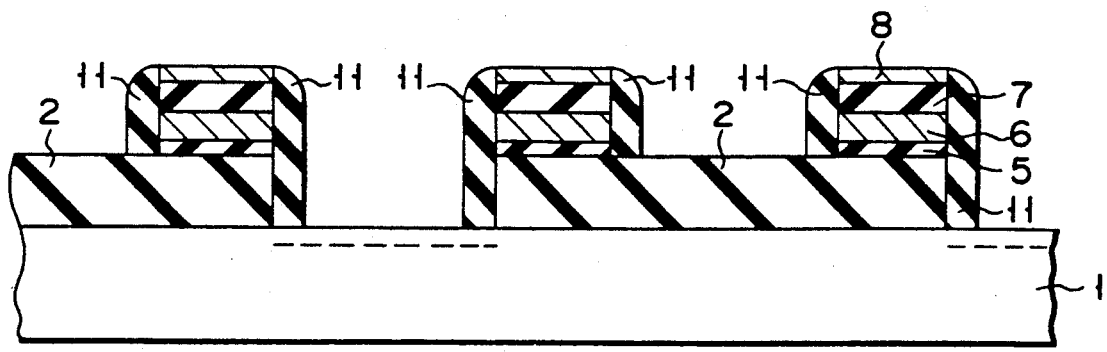
F I G. 5D
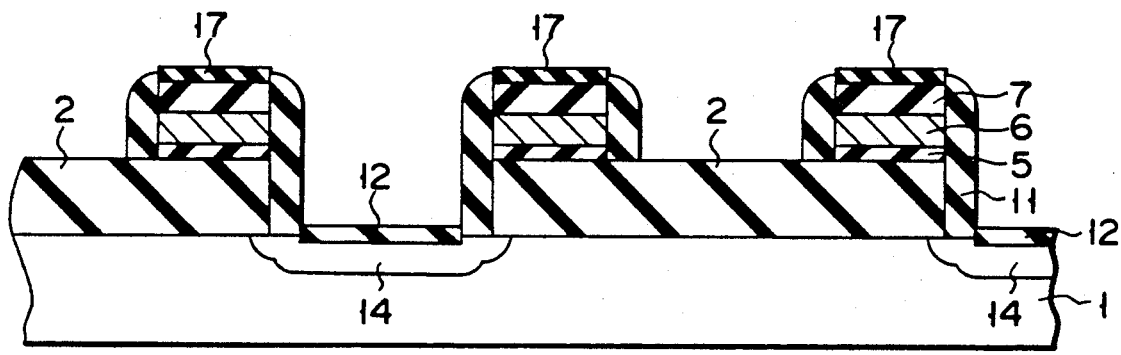
F I G. 5E
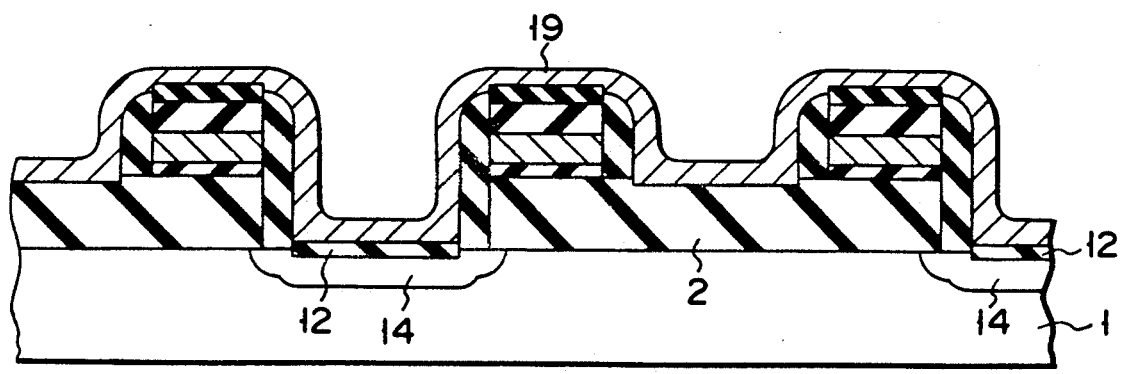
F I G. 5F

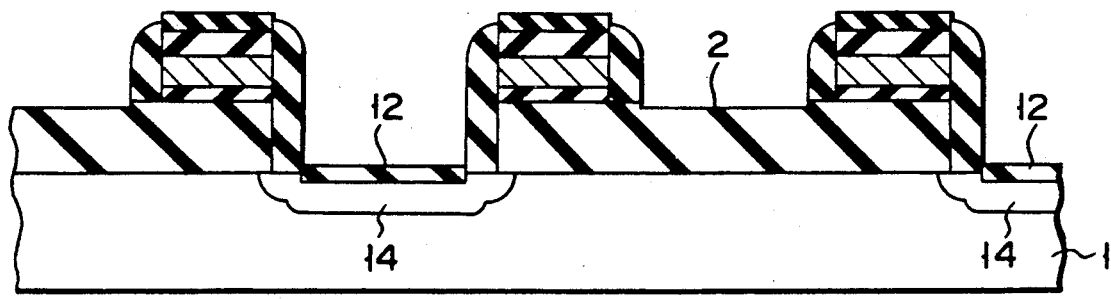
F I G. 5G
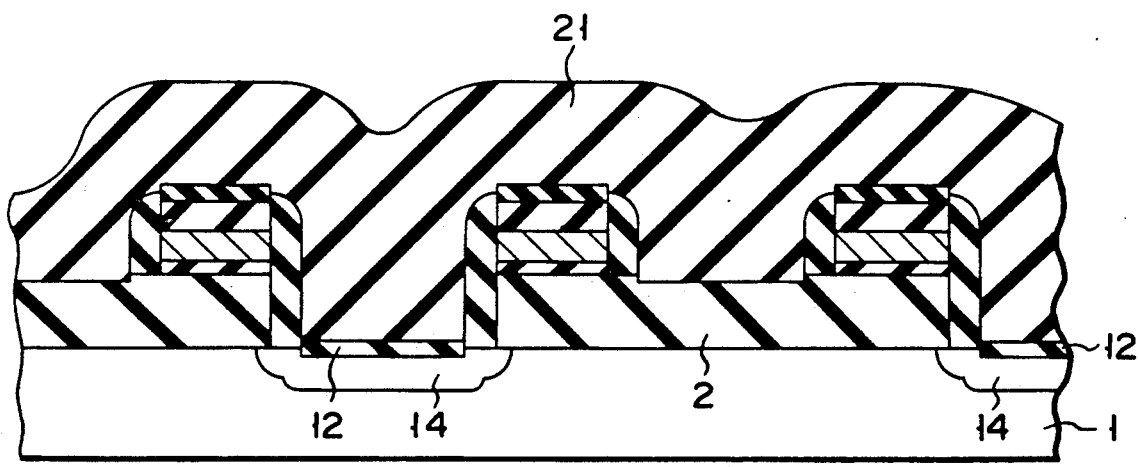
F I G. 5H

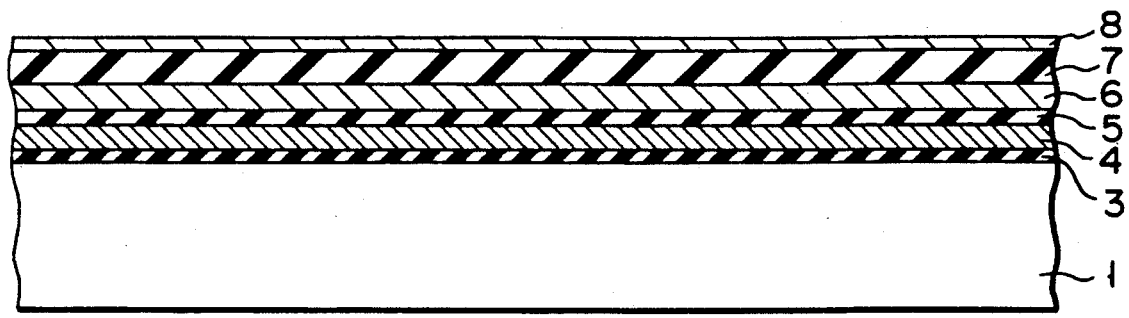
F I G. 6A
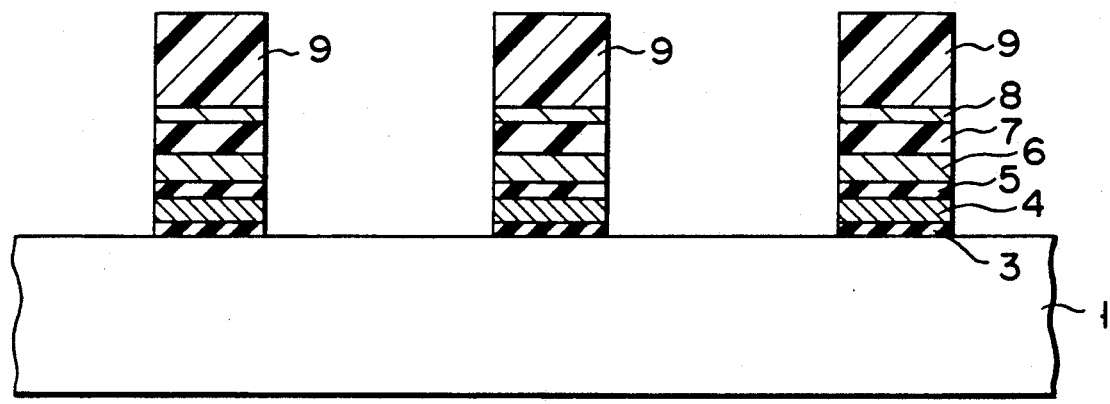
F I G. 6B
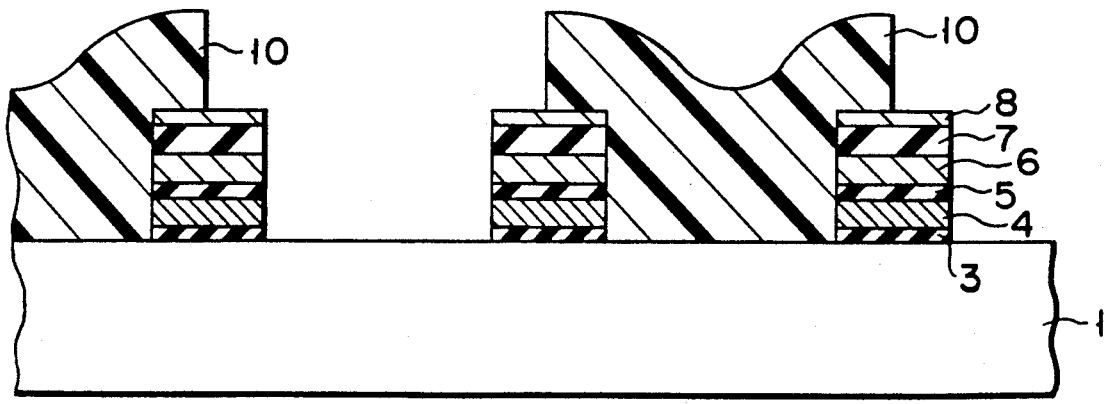
F I G. 6C

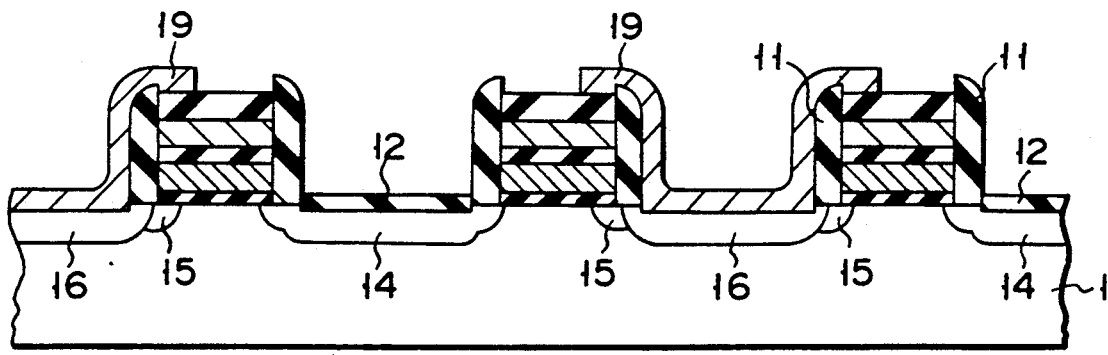
F I G. 6H
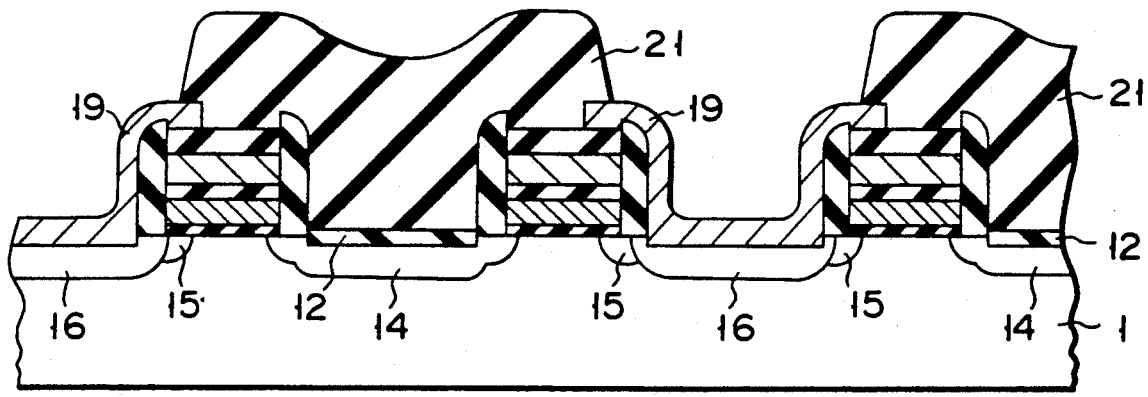
F I G. 6I
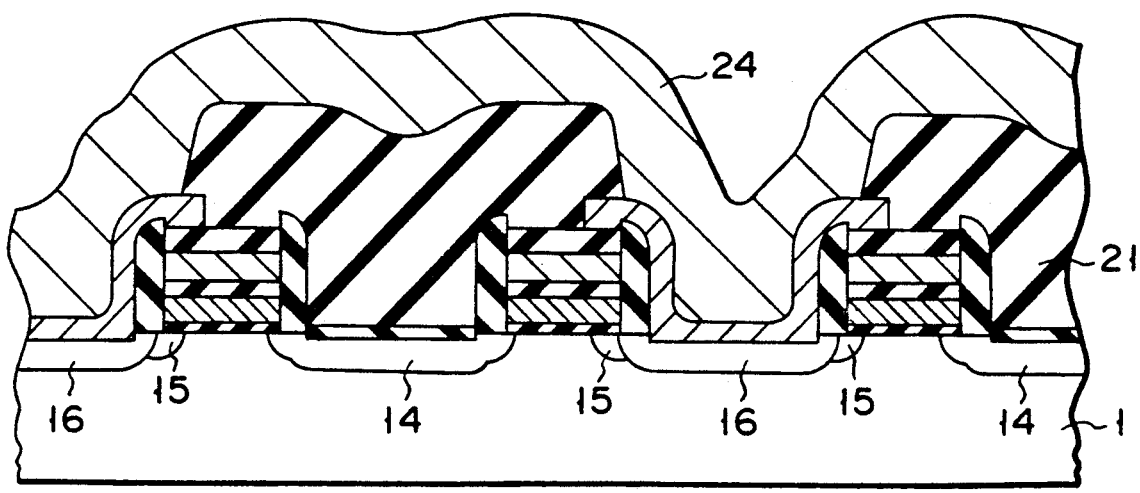
F I G. 6J

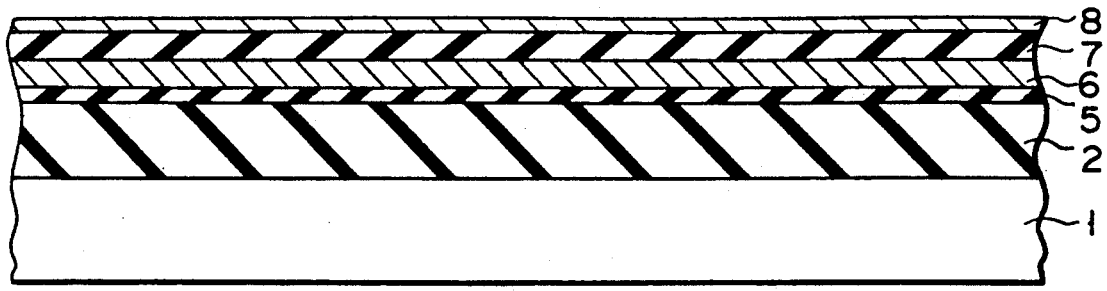
F I G. 7A
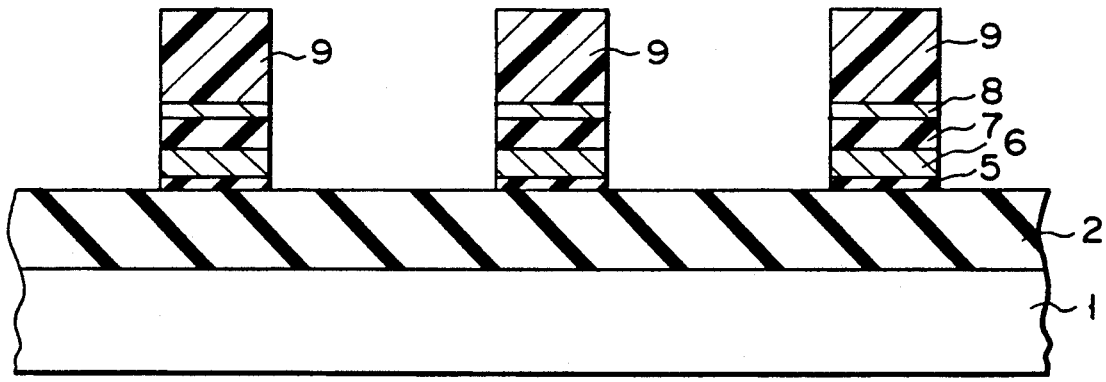
F I G. 7B
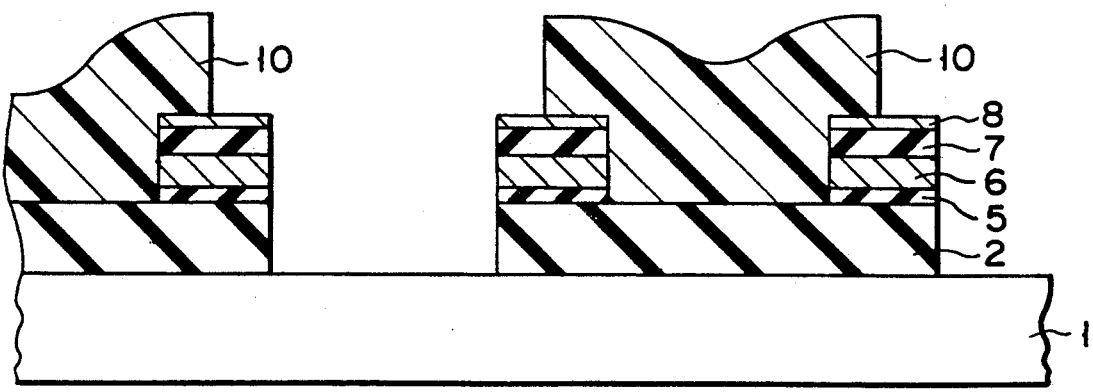
F I G. 7C

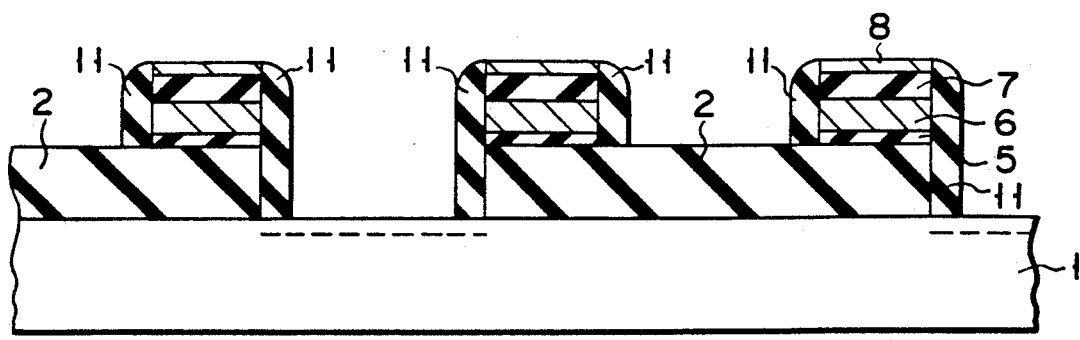
F I G. 7D
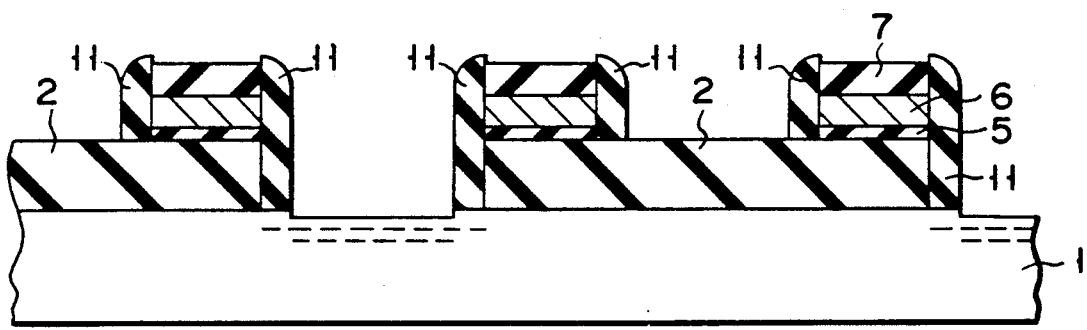
F I G. 7E
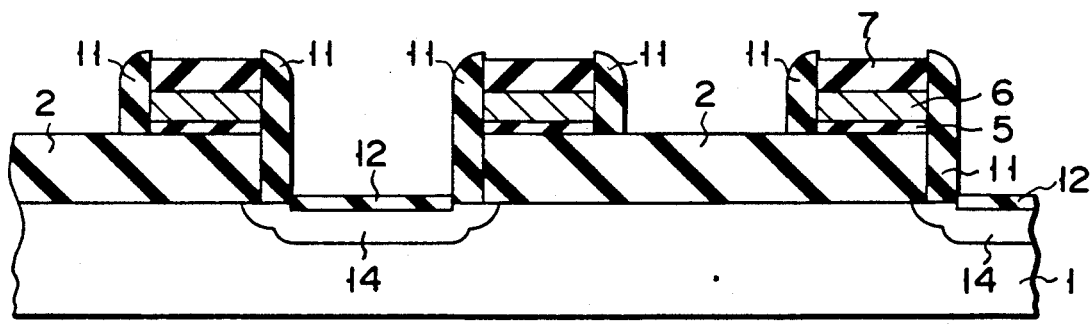
F I G. 7F
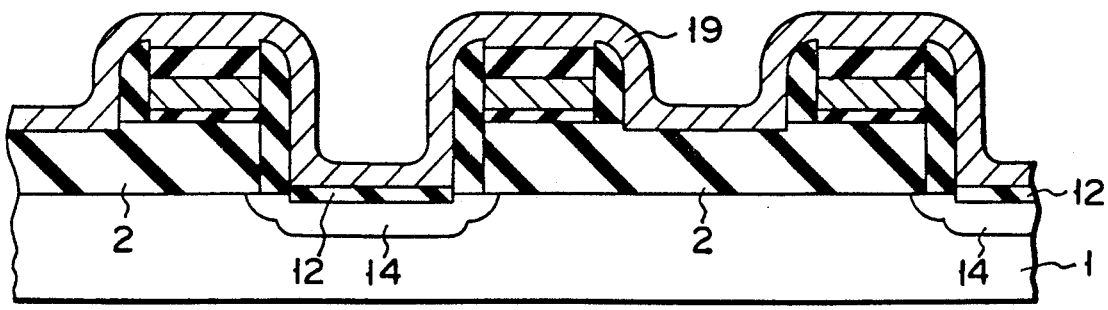
F I G. 7G

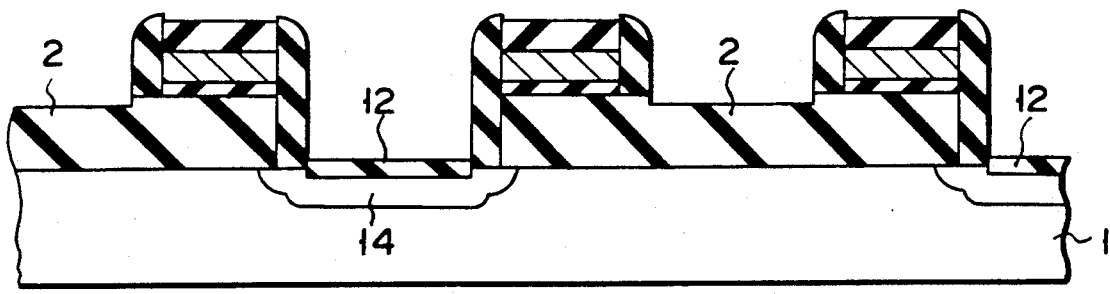
F I G. 7H
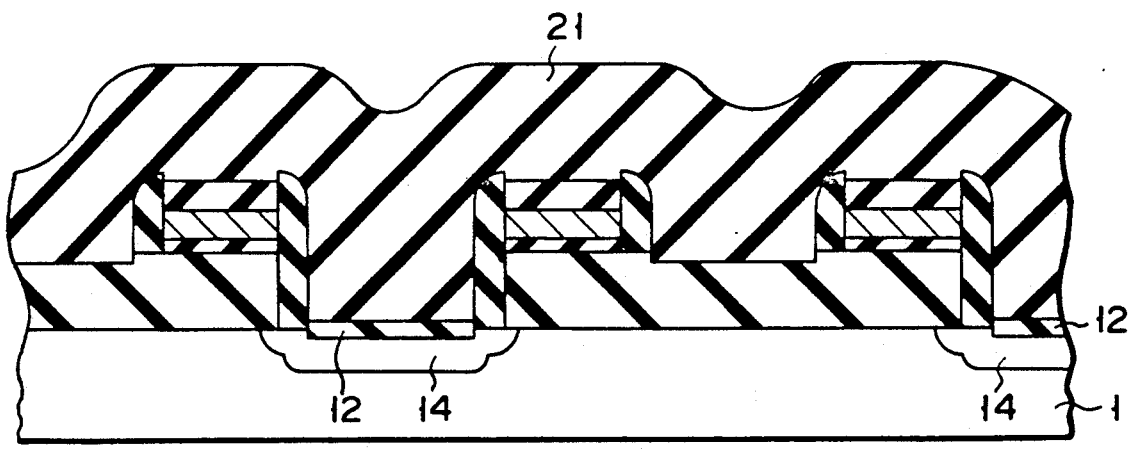
F I G. 7I

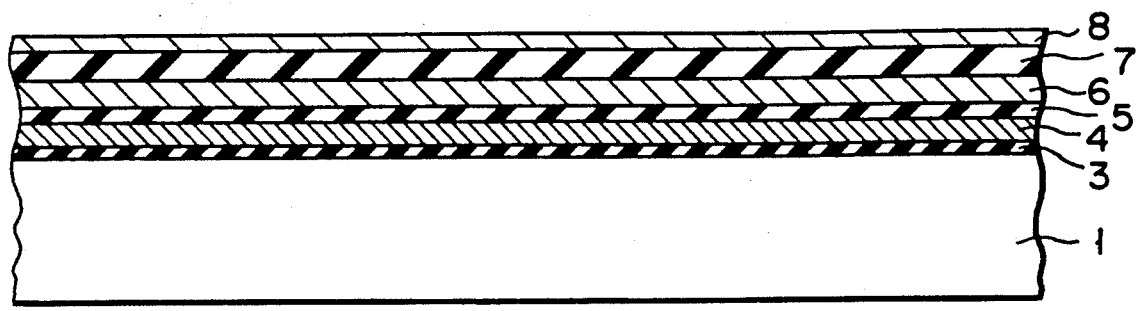
F I G. 8A
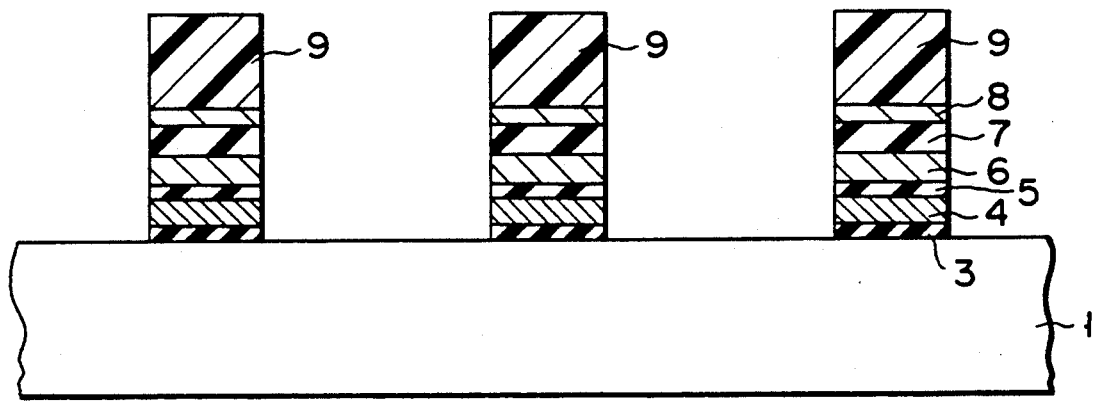
F I G. 8B
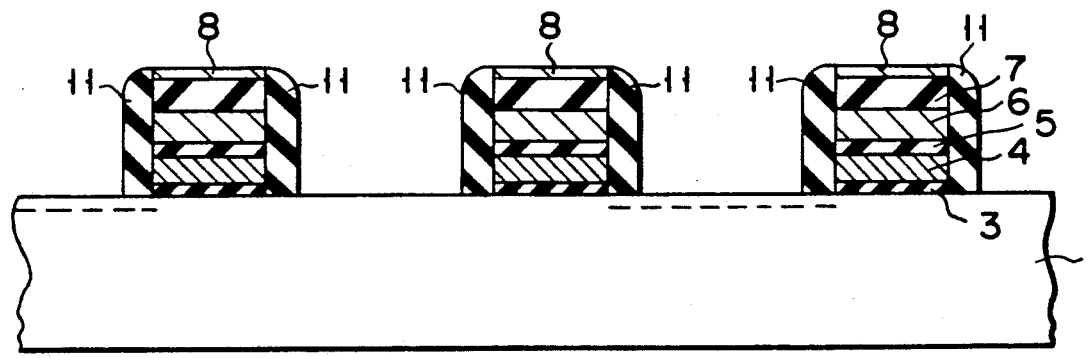
F I G. 8C

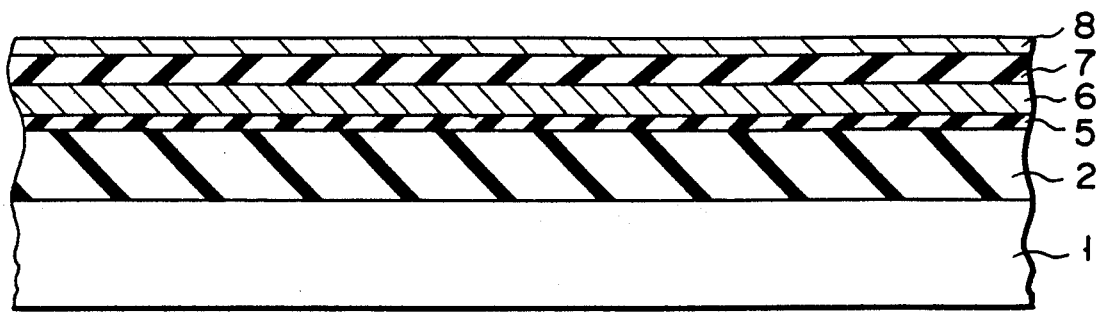
F I G. 9A
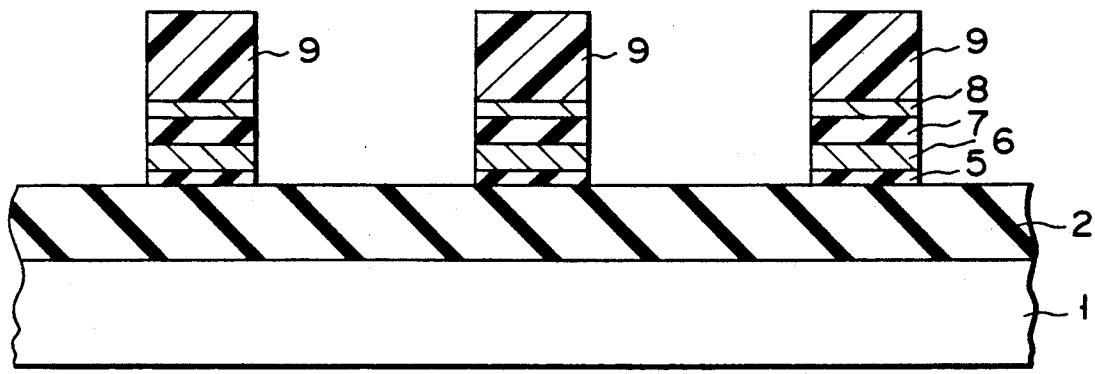
F I G. 9B
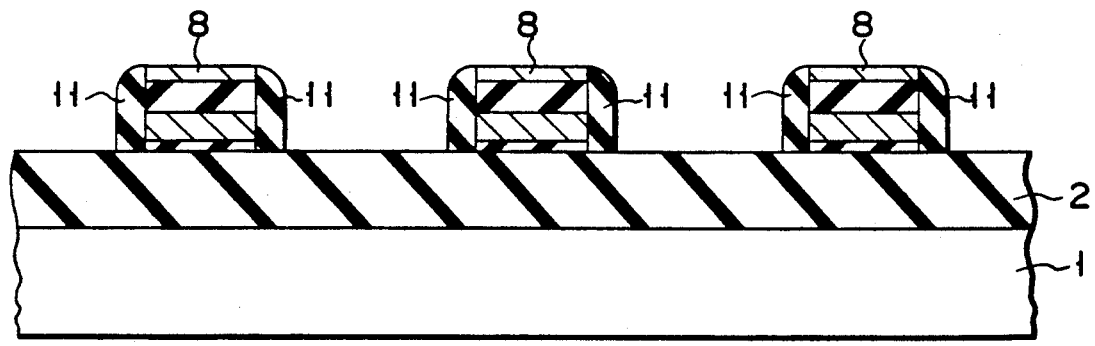
F I G. 9C

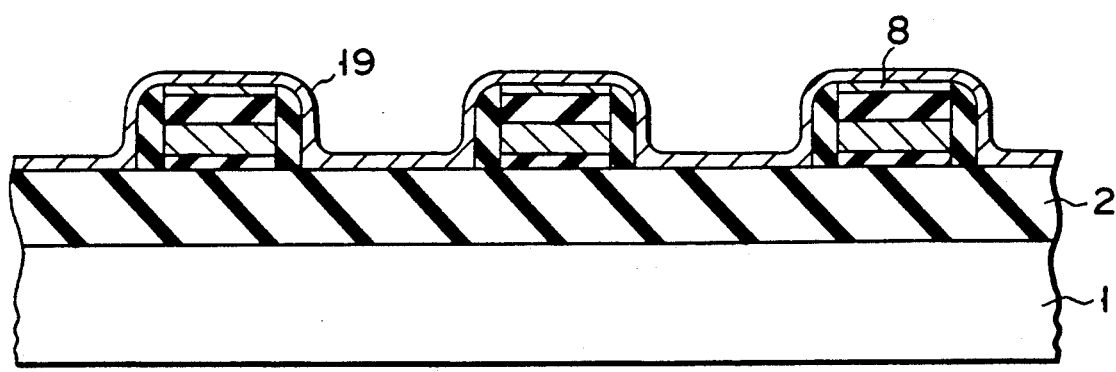
F I G. 9D
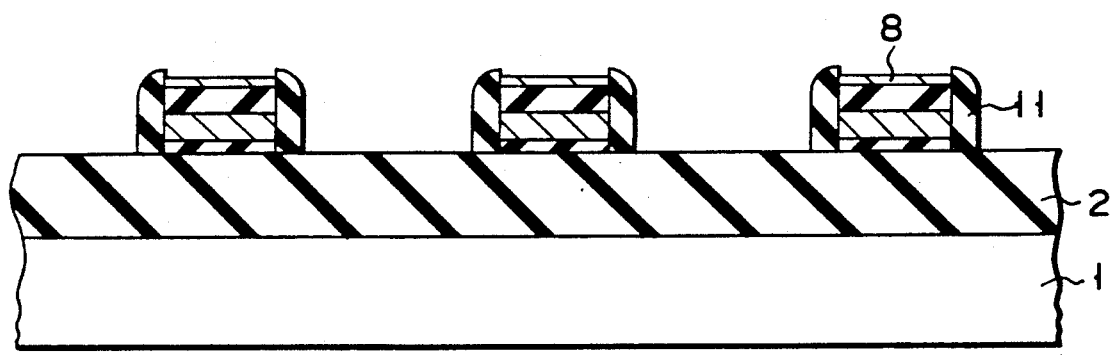
F I G. 9E
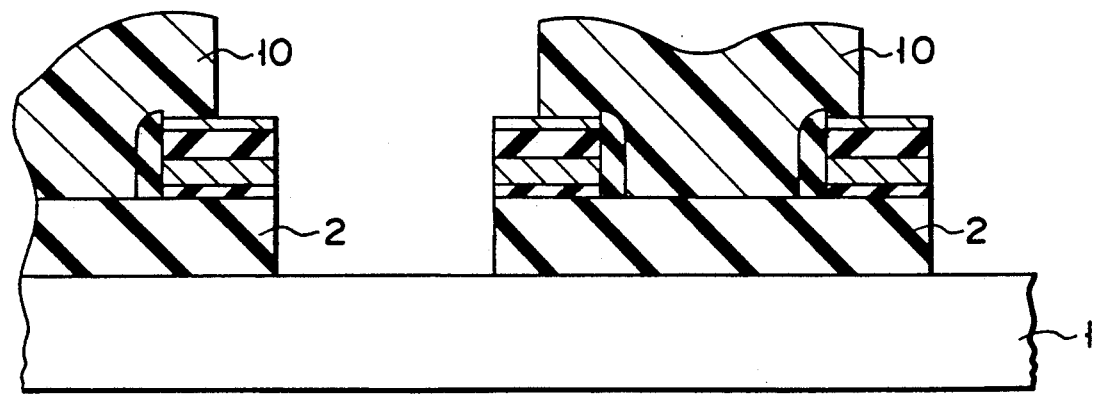
F I G. 9F

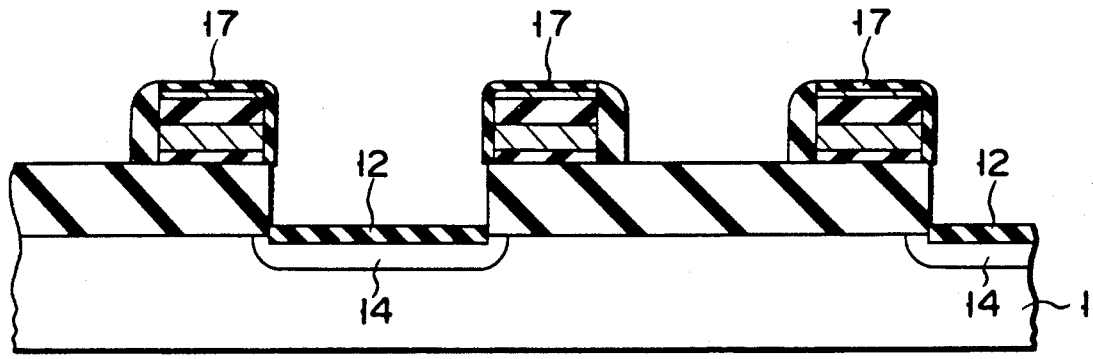
F I G. 9G
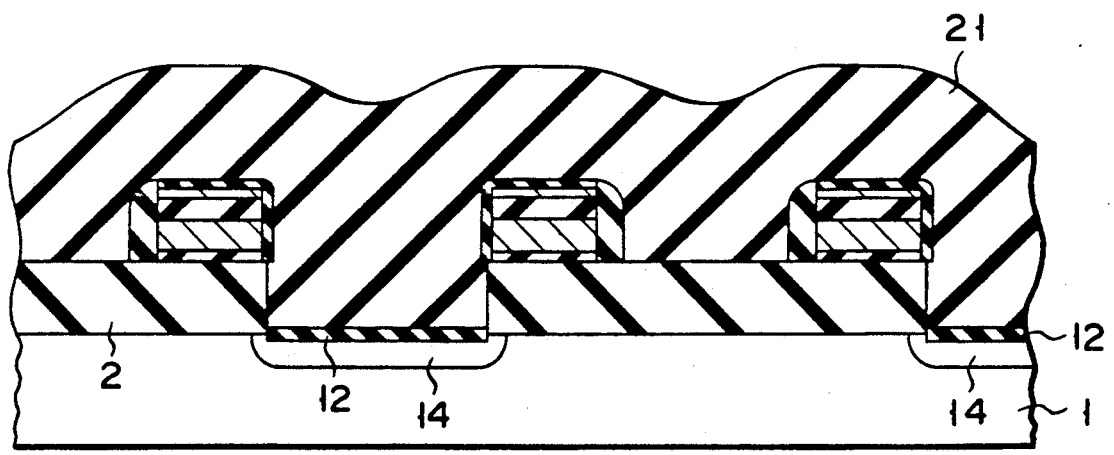
F I G. 9H

METHOD OF MANUFACTURING NON-VOLATILE SEMICONDUCTOR MEMORIES, IN WHICH SELECTIVE REMOVAL OF FIELD OXIDATION FILM FOR FORMING SOURCE REGION AND SELF-ADJUSTED TREATMENT FOR FORMING CONTACT PORTION ARE SIMULTANEOUSLY PERFORMED

BACKGROUND OF THE INVENTION

1. Field of the Invention

This invention relates to a manufacturing method of semiconductor devices. It is especially suitable for manufacturing non-volatile semiconductor memory devices.

2. Description of the Related Art

A memory cell transistor in a non-volatile semiconductor memory device (EPROM) hitherto has such a structure as shown in FIG. 1, for instance. A gate electrode portion 25 having a two-layer gate structure is formed on each of element regions of a semiconductor substrate (silicon substrate) 1. The gate electrode portion 25 has a first gate insulating film 3, a floating gate electrode 4, a second gate insulating film 5, a control gate electrode 6, and an insulating film 7, all of which are formed on a main surface of the semiconductor substrate 1. These elements are formed by successively placing one over another. The side walls of gate electrode portion 25 are covered with the insulating film 7. Those portions of the insulating film 7 that cover the side walls are formed by the side walls of the electrode 6 and the side walls of the electrode 4 being oxidized when the insulating film 7 is formed on the control gate electrode 6 by thermal oxidation. Impurity diffusion regions 14 and 16, which are respectively to be a source region and a drain region of a floating gate type MOS transistor, are formed in that portion of the substrate 1 that is below the gate electrode portion 25 with a channel region interposed between them. In the structure shown in FIG. 1, the impurity diffusion region 16 is commonly used by any two adjacent floating gate type MOS transistors (memory cell transistors). On the resultant structure an interlevel insulating film 21 is formed. The interlevel insulating film 21 has a plurality of contact holes 26 each at that portion that is above one of the impurity diffusion regions (the drain region 16, for instance). Metal wiring layers (aluminum wiring layers, for instance) 24 functioning as bit lines are formed over the interlevel insulating film 21 such that they contact through the contact holes 26 with the drain regions 16.

Note that, when manufacturing the above-mentioned EPROM, a field oxide film (not shown in the drawings) for element isolation is used as a reference for mask alignment. Therefore, a certain amount of margin must be allowed when mask alignment is performed to form contact holes, when the margin is not allowed, those portions of the insulating film 7 that cover the side walls of the gate electrode portion 25 may be removed by etching, and the aluminum wiring layers 24 and the control gate electrode 6, or the floating gate electrode 4, of the memory cell transistor may be short-circuited in a worst case.

Therefore, the above-mentioned conventional EPROM requires a margin between the gate electrode portion and the contact hole when mask alignment is performed. The amount of the margin is determined by the exposure system, etc. Therefore, the reduction of the space between memory cell transistors has a limit, which hinders cell miniaturization.

To solve the above problem, the present inventors had already proposed a semiconductor integrated circuit device and its manufacturing method, which realize reduction of the margin between the control gate electrode, or the floating gate electrode, and the contact hole when performing a mask alignment to make the contact hole, and promote miniaturization (Japanese Unexamined Publication No. 1-251761 corresponding to Japanese Patent Application No. 63-78980). One example of a semiconductor integrated circuit device in accordance with the above-identified application is shown in FIGS. 2A and 2B. FIG. 2A is a plan view showing a pattern, and FIG. 2B is a sectional view taken along an X-X' line of FIG. 2A for showing the sectional structure.

This semiconductor integrated circuit device comprises memory cell arrays, each having floating gate type MOS transistors. In each of the MOS transistors, a source region 14 and a drain region 16 are self-align formed with respect to a multilayer-structured pattern which is made of a floating gate electrode 4 and a control gate electrode 6. A gate electrode portion 25 has an insulating film 7 on its upper surface and an insulating film 11 on its side walls. A low concentration impurity diffusion region 15 is formed at that portion of the drain region 16 that is near the channel region. A conductive layer 19 made up of a low resistance material covers the surface of the drain region 16 and the surface of at least those portions of the insulating film 11 that are on the side walls of the gate electrode portions 25 and are located at the end of the region 16. An interlevel insulating film 21 is formed on the resultant structure. A contact hole 26 is formed in that portion of the interlevel insulating film 21 that is above the conductive layer 19. Metal wiring layers 24 are formed on the interlevel insulating film 21 and the conductive layer 19 within the contact hole 26, and the metal wiring layers 24 are electrically connected with the drain region 16.

The characteristic feature of the structure shown in FIGS. 2A and 2B is that the conductive layer 19 is interposed between the drain region 16 and the metal wiring layers 24. Namely, the conductive layer 19 protects the side walls of each gate electrode portion 25 when making the contact hole 26, so that the margin between the gate electrode portion 25 and the contact hole 26 can be made as small as possible. Therefore, miniaturization of the device can be promoted.

In the above structure, the field oxide film 2 for element isolation is discretely formed, as shown in FIG. 2A, so that the distance d between the end of the gate electrode portion 25 (the insulating films 7 and 11) and the end of the field oxide film 2 must be set carefully in consideration of the margin for mask alignment, or the width of the source region 14 will be narrow, when divergence in mask alignment occurs, and thus the element characteristics will be degraded.

As explained above, in the conventional semiconductor device manufacturing method, the margin between the gate electrode portion and the contact hole for the source or drain must be sufficiently allowed for mask alignment, so that the space between the memory cell transistors cannot be made narrow. If it is made narrow, the element characteristics will be degraded.

SUMMARY OF THE INVENTION

Therefore, the object of the present invention is to provide a semiconductor device manufacturing method which realizes a high integration without causing degradation in element characteristics.

Another object of the present invention is to provide a semiconductor device manufacturing method which realizes simplification in manufacturing steps.

These objects are achieved by a semiconductor device manufacturing method comprising:

a step of forming strip shaped first insulating films separately extending in parallel with each other over a surface of a semiconductor substrate of a first conductivity type;

a step of forming over the semiconductor substrate and the strip shaped first insulating films a plurality of stacked gate structures extending in parallel with each other and in perpendicular to the strip shaped first insulating films, each stacked gate structure including a second insulating film, a floating gate electrode, a third insulating film, a control gate electrode, a fourth insulating film, and an etching stop film having a slower etching speed than the fourth insulating film;

a step of self-align removing those portions of each of the first insulating films that are located between any two of the adjacent stacked gate structures extending in parallel with each other and are located above source forming regions with using one end side of each of the stacked gate structures as a part of a mask, so as to expose those portions of the semiconductor substrate that are located at the source forming regions;

a step of self-align introducing impurities of a second conductivity type into each of the source forming regions using the one end side of each of the stacked gate structures as a mask;

a step of forming fifth insulating films on the side wall portions of each of the stacked gate structures;

a step of self-align introducing impurities of the second conductivity type into each of drain forming regions using the other end side of each of the stacked gate structures;

a step of self-align exposing those portions of the semiconductor substrate that are located at the drain forming regions with using as parts of a mask the fifth insulating films each formed on the other end side of each of the stacked gate structures;

a step of forming conductive layers which contact with surfaces of the exposed drain regions and cover at least those parts of the fifth insulating films that are laid on the walls of the drain region side of each of any two adjacent stacked gate structures with one of the exposed drain regions being interposed between them;

a step of forming sixth insulating films on the resultant structure;

a step of making contact holes by selectively removing the sixth insulating films with using the conductive layers as stoppers; and a step of forming wiring patterns on those portions of the sixth insulating films that include the contact holes.

The provision of the fourth insulating films and the etching stop films having much slower etching speeds than the fourth insulating films on the two layer gate structures makes it possible to simultaneously perform the step of selective removal of the first insulating films (the field oxide films) for the formation of the source regions and the step of self adjusted treatment for the formation of the drain contact portions. Therefore, the margins for mask alignment can be reduced without increasing manufacturing steps. As a result, both miniaturization and high integration can be easily achieved. In addition, since the field oxide films are formed as parallel strips, there is no fear that the width of each of the source regions becomes narrow to degrade the element characteristics due to the occurrence of divergence when mask alignment. Therefore, a semiconductor device manufacturing method is provided which realizes a high integration without incurring degradation in element characteristics, and simplifies manufacturing steps.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3I are plan views showing patterns arranged in manufacturing step order for explaining a semiconductor device manufacturing method in accordance with a first embodiment of the present invention;

FIGS. 4A to 4I are respectively sectional views taken along the Z-Z' lines in the patterns shown in FIGS. 3A to 3I;

FIGS. 5A to 5H are respectively sectional views g taken along the Y-Y' lines in the patterns shown in FIGS. 3A to 3I;

FIGS. 6A to 6J and FIGS. 7A to 7I are sectional views arranged in manufacturing step order for explaining a semiconductor device manufacturing method in accordance with a second embodiment of the present invention; and FIGS. 8A to 8I and FIGS. 9A to 9H are sectional views arranged in manufacturing step order for explaining a semiconductor device manufacturing method in accordance with a third embodiment of the present invention.

DETAILED DESCRIPTION OF THE PREFERRED EMBODIMENTS

Each set of FIGS. 3A to 3I, FIGS. 4A to 4I, and FIGS. 5A to 5H shows a series of EPROM manufacturing steps in order for explaining the semiconductor device manufacturing method in accordance with a first embodiment of the present invention. FIGS. 3A to 3I are plan views showing patterns obtained at the respective manufacturing steps. The next two sets of FIGS. 4A to 4I and FIGS. 5A to 5H respectively show sectional views taken along Z-Z' lines and sectional views taken along Y-Y' lines in the corresponding patterns in FIGS. 3A to 3I.

Figure 1:
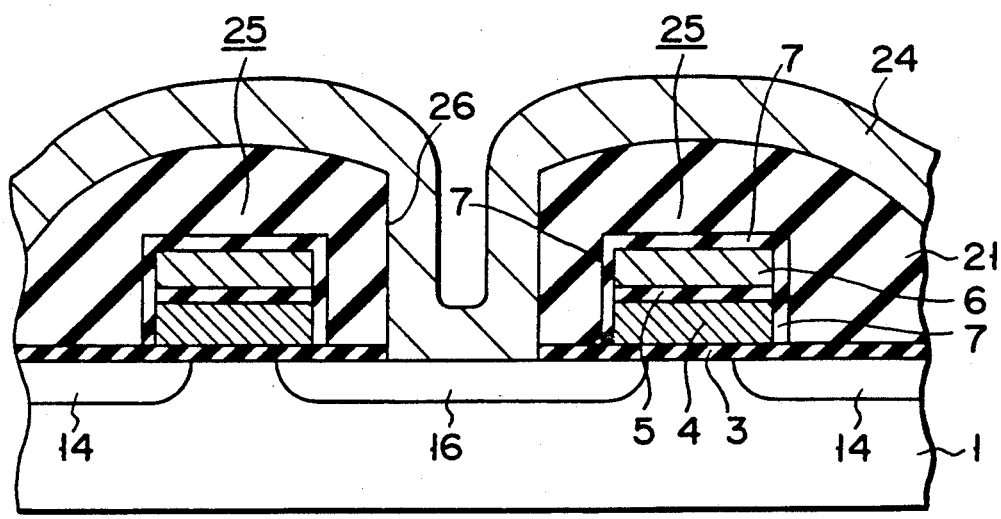
FIG. 1 is a sectional view showing the structure of a memory cell transistor of a conventional EPROM.
Figure 2A:
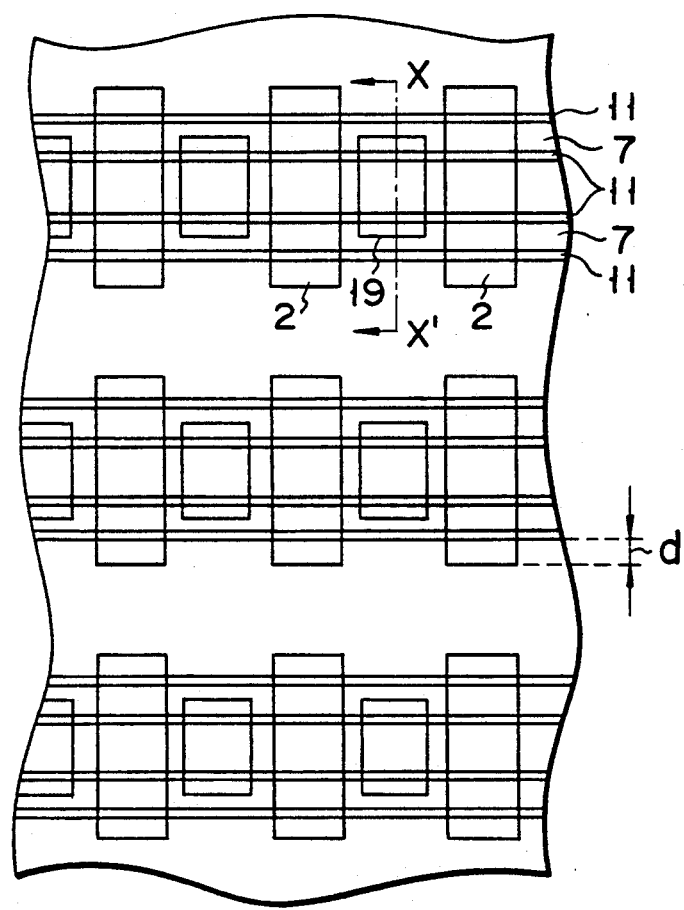
FIG. 2A is a plan view of the pattern showing the structure of the memory cell transistor of the conventional EPROM modified by the present inventors.
Figure 2B:
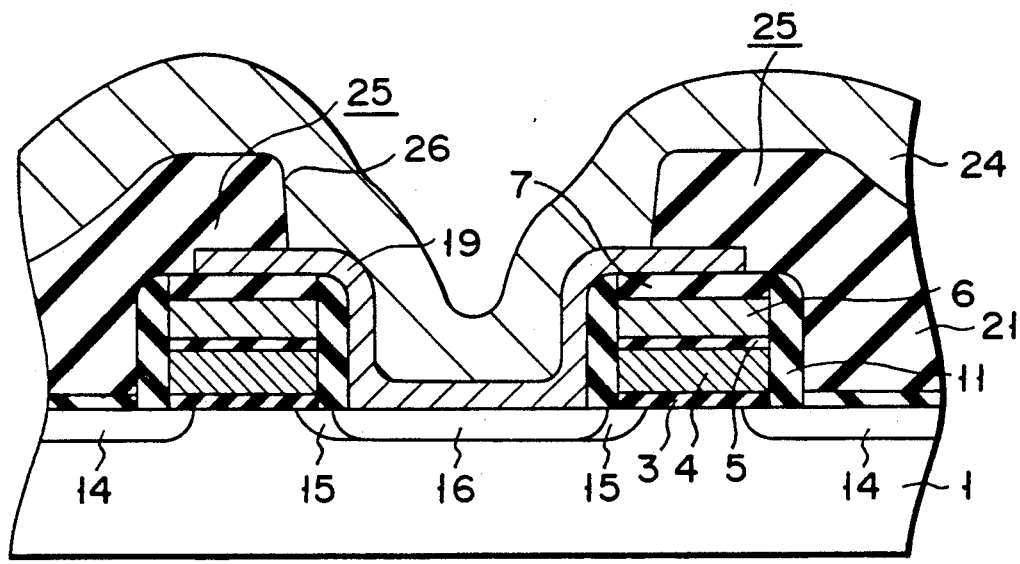
FIG. 2B is a sectional view taken along the X-X' line of the pattern shown in FIG. 2A.
Figure 3A:
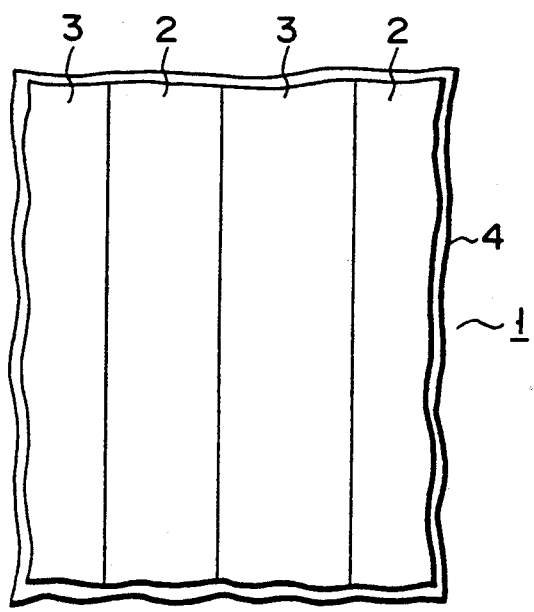
Figure 3B:
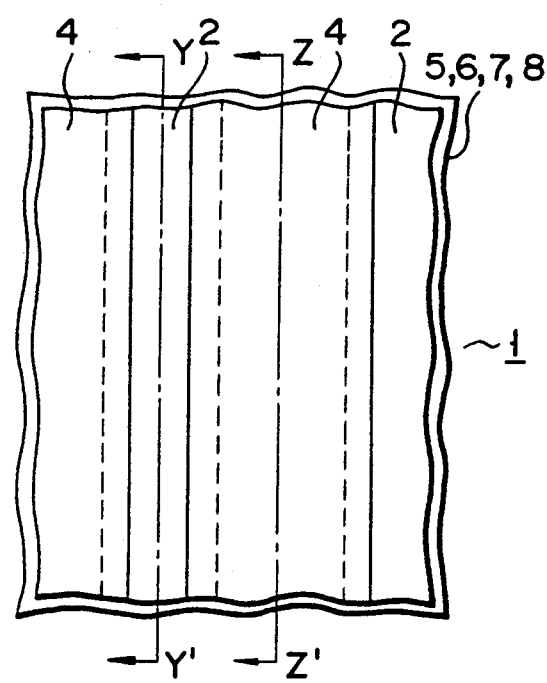
Figure 4A:
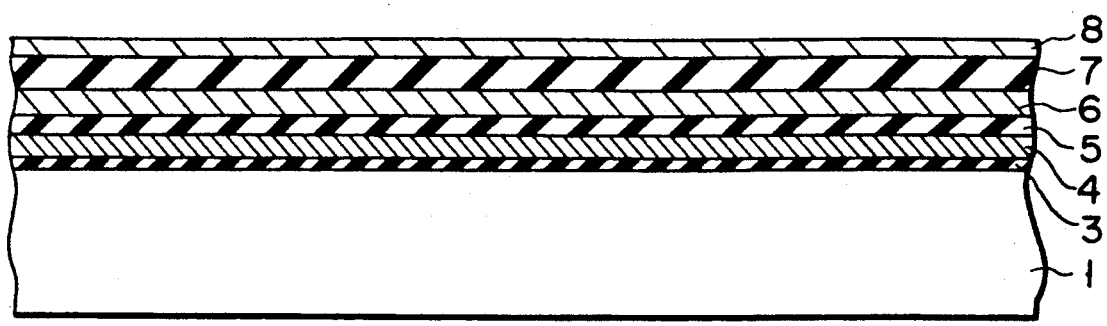

First of all, element isolation is performed, for instance, by forming on a surface of a P-type silicon substrate 1 a plurality of strip shaped field oxide films 2, as shown in FIG. 3A, using a known technique. Then, first gate insulating films 3 each having a thickness of about 200 Å are formed on the surface of the silicon substrate 1 using a thermal oxidation method, such that the field oxide films 2 and the first gate insulating films 3 are alternately arranged. After that, a first polycrystalline silicon layer 4 having a thickness of about 200 Å is deposited over the entire surface of the resultant structure using a vapor phase growing method. Impurities such as phosphorous are doped into the polycrystalline silicon layer 4 by an ion-implantation or thermal diffusion method with using $POCl_3$ as a diffusion source. Then, the polycrystalline silicon layer 4 is selectively removed for floating gate isolation using photoresists (FIG. 3B), and a second gate insulating film 5 having a thickness of about 300 Å is formed over the entire surface of the resultant structure. Then, a second polycrystalline silicon layer 6 is deposited on the second gate insulating film 5 using the vapor phase growing method, and phosphorous is doped into the second polycrystalline silicon layer 6 as an impurity material. A first insulating film 7 is deposited on the polycrystalline silicon layer 6, and a third polycrystalline silicon layer 8 having a thickness of about 100 Å is deposited over the entire surface of the insulating film 7 using the vapor phase growing method (FIGS. 4A and 5A).

Figure 3C:
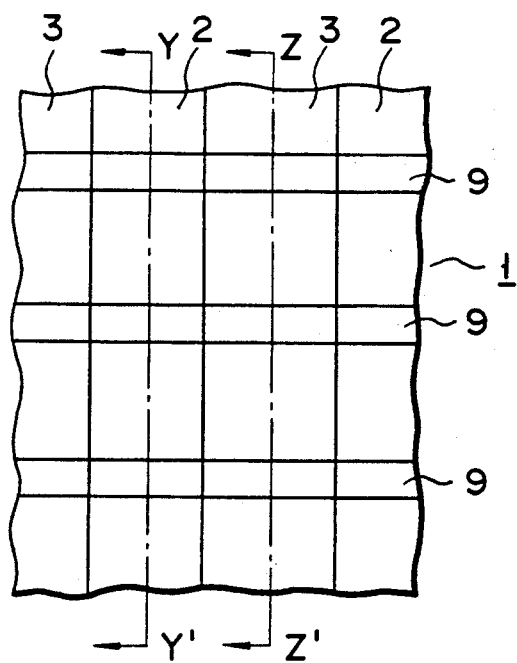
Figure 4B:
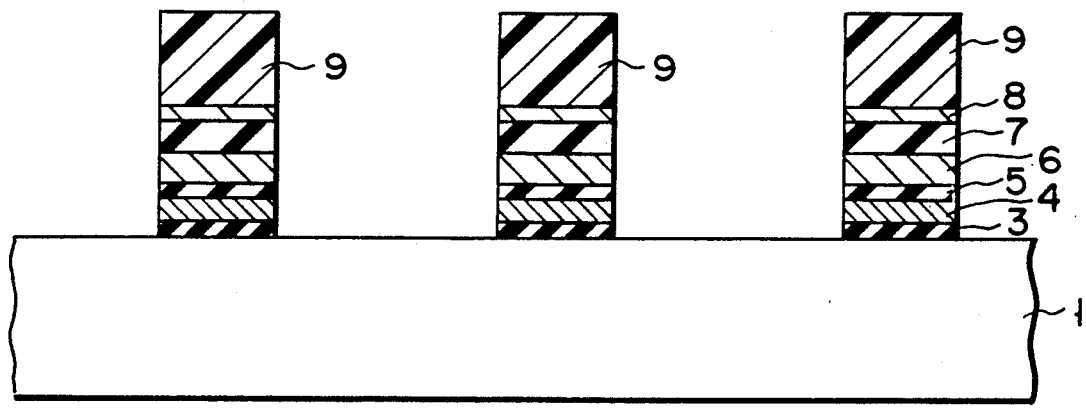

As shown in FIGS. 3C, 4B and 5B, the third polycrystalline silicon layer 8, the first insulating film 7, the second polycrystalline silicon layer 6, the second gate insulating film 5, the remained first polycrystalline silicon layers 4, and the first gate insulating films 3 are selectively etched in succession by an anisotropic etching method using the resist patterns 9 as masks so as to form cell transistor regions and gate electrode regions.

Figure 3D:
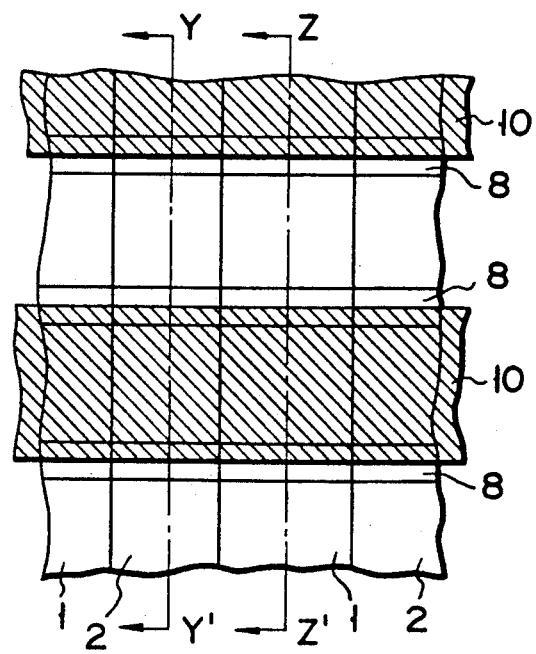
Figure 4C:
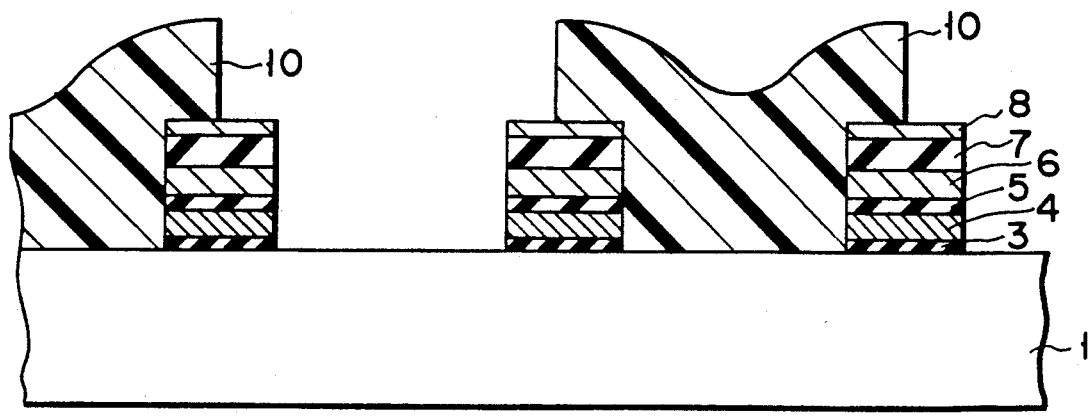

Those portions of each of the strip shaped field oxide films 2 that are located at the source forming regions are selectively removed by a reactive ion etching method, which uses photoresist mask 10 which is aligned with reference to the patterns of the stacked gate structure, and thus those portions of the substrate 1 that are located at the source forming regions are exposed (FIGS. 3D, 4C and 5C).

Arsenic, for instance, is ion-implanted as an impurity into the source forming regions under a condition of 40 KeV in acceleration energy and $2 \times 10^{15}$ cm$^{-2}$ in dose, while the drain forming regions are being covered with the photoresist mask 10. After the photoresist mask 10 is removed, the source forming regions are covered with photoresist mask not shown in the drawings, and then phosphorous, for instance, is ion-implanted as an impurity into the drain forming regions under a condition of 40 KeV in acceleration energy and $5 \times 10^{14}$ cm$^{-2}$ to form low concentration impurity diffusion regions at the drain forming regions.

Figure 3E:
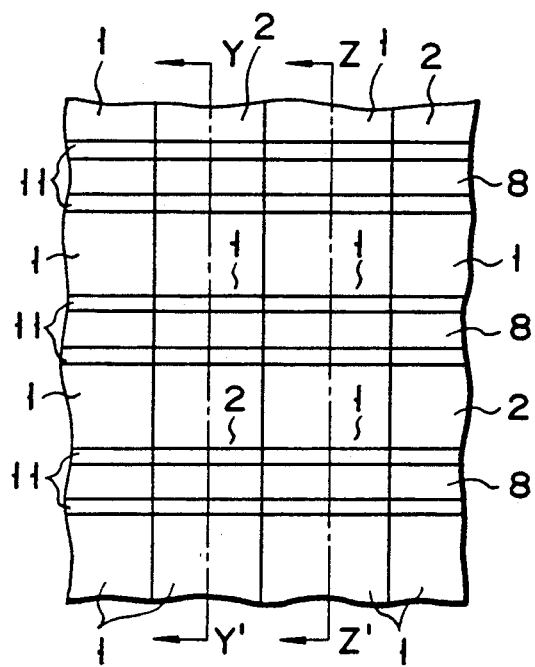
Figure 3F:
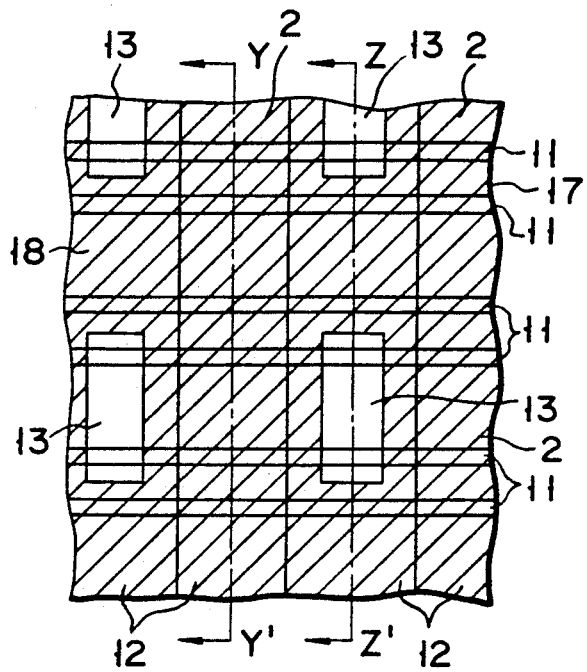
Figure 4D:
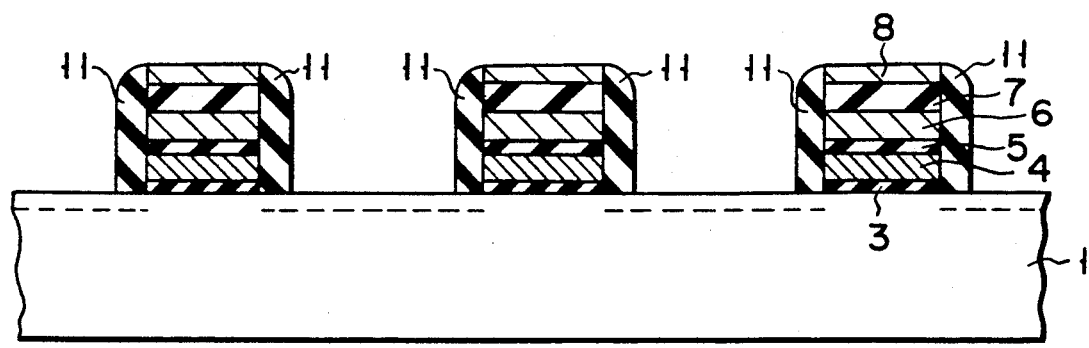
Figure 4E:
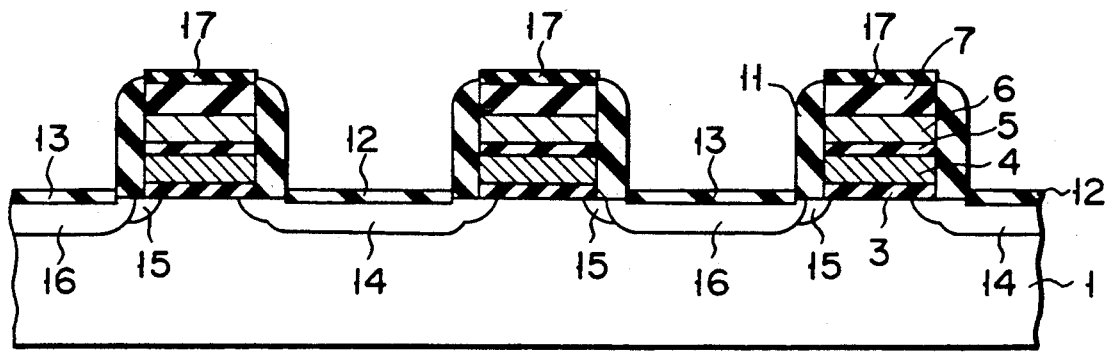

Then, a first CVD-$SiO_2$ film 11, for instance, is deposited on the resultant structure, and then is selectively etched by the reactive ion etching method, so that some portions of the $SiO_2$ film are left out on the side walls of each gate electrode portion, as shown in FIGS. 3E, 4D and 5D. After that, arsenic, for instance, is ion implanted into the substrate 1 under the condition of 40 KeV in acceleration energy and $2 \times 10^{15}$ cm$^{-2}$ in dose. Furthermore, silicon oxide films 12 and 13 are respectively formed on the surface of the source regions and that of the drain regions of the substrate 1. Note that both the ion implanted arsenic and phosphorous are diffused in this process, and high concentration impurity regions 14 are formed for the source regions, and low concentration impurity regions 15 and high concentration impurity regions 16 are formed for the drain regions. Thus, an LDD (Lightly Doped Drain) structure is obtained. Furthermore, the polycrystalline silicon layers 8 are oxidized to be silicon oxidation films 17 (FIGS. 4E and 5E).

Figure 3G:
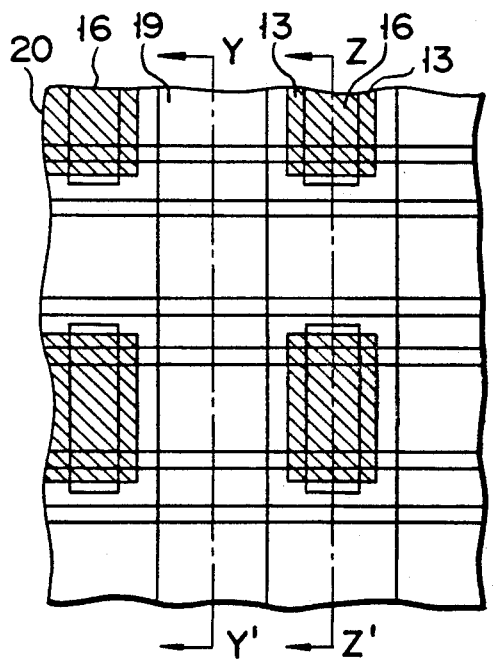
Figure 4F:
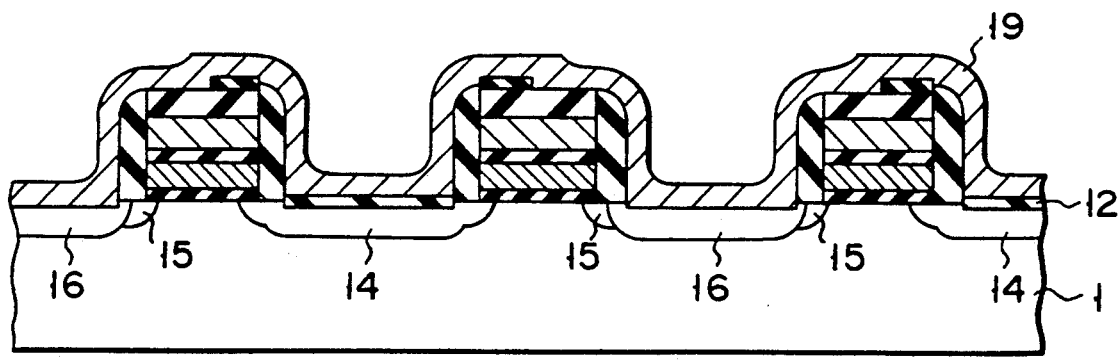

The silicon oxide films 13 on the surfaces of the drain regions 16 are etched using a photoresist mask 18 (the obliquely lined portion in FIG. 3F) which is aligned with reference to the field oxide films 2. A fourth polycrystalline silicon layer 19 having a thickness of about 100 Å is deposited on the resultant structure by the vapor phase growing method as shown in FIGS. 4F and 5F. Then, impurities are doped into the fourth polycrystalline silicon layer 19, and each resist is made to have a pattern with making use of each gate electrode region as a reference of mask alignment so as to form each resist pattern 20 (obliquely lined portions), as shown in FIG. 3G. The fourth polycrystalline silicon layer 19 is etched with using the resist pattern 20 as a mask, so that each of the remained portions of the fourth polycrystalline silicon layer 19 covers both the surface of corresponding one of the drain regions 16 and the surfaces of corresponding two $SiO_2$ films 11 attached on the facing side walls of adjacent two gate electrodes with interposing the corresponding one of the drain regions 16 in between.

A second CVD-$SiO_2$ film 21, from which interlevel insulator is formed, is deposited on the resultant structure by a low pressure CVD (LPCVD) method. Then, a resist is made to have a pattern with using the gate electrodes as a reference of mask alignment so as to form a resist pattern 22 (obliquely lined portion in FIG. 3H). The resist pattern 22 is used as a mask while the remained portions of the fourth polycrystalline silicon layer 19 are used as a stopper to etch the $SiO_2$ film 21 as shown in FIGS. 4H and 5H. An aluminum layer, for instance, is deposited on the resultant structure by a spattering method, and a pattern of a resist is made with using a pattern of contact openings (namely, the etched pattern of the $SiO_2$ film 21) as a reference of alignment. The aluminum layer is etched with using resist pattern 23 (obliquely lined portion in FIG. 3I) as a mask so as to form a wiring pattern 24 as shown in FIG. 4I.

Now, the manufacturing process of drain-contact portions has just been explained, but source-contact portions are formed by a self-align contact hole forming method in the same manner. After both portions have been formed, passivation films and bonding pads are formed on the wiring pattern 24 by a known MOS integrated circuit manufacturing method, and a complete EPROM is made.

In the above manufacturing method, the polycrystalline silicon layer 8 is deposited, with the insulating film 7 interposed in between, on the two layer gate structure comprising the first gate oxide film 3, the floating gate electrode 4, the second gate insulating film 5, and the control gate electrode 6, so that the self-align etching process of the field oxide films 2 for the formation of the source regions and the self-align process for the formation of the drain-contact portions are simultaneously performed. Therefore, the margin for mask alignment can be made as narrow as possible without increasing manufacturing steps, and the miniaturization and the high integration become easy. Furthermore, since the field oxide films 2 are each formed to have a strip shape and are arranged in parallel with each other, the source forming regions will not be narrow even when the mask is misaligned, so that there is no fear that the circuit characteristics are degraded.

Note that the polycrystalline silicon layer 8, the upper most layer of each stacked gate structure, is completely made to be the silicon oxide film 17 by thermal oxidation in the first embodiment, as shown in FIGS. 4E and 5E. However, the polycrystalline silicon layer 8 need not be completely oxidized, but it may be possible to partially remain the polycrystalline silicon layer 8. Any material may be used as the layer 8, if only it has an etching selective ratio with respect to the side walls of the gate (in the above embodiment CVD-$SiO_2$ films 11), and there is no need to oxidize the material by the thermal oxidation.

The polycrystalline silicon is used as a low resistant conductive material for self-align forming the contact holes in the embodiment, but it is needless to say that the same effect can also be obtained by the other suitable conductive material.

In the above first embodiment, the introduction of high impurities into the drain regions 16 and the doping of impurities into the conductive layer 19 are performed in separate steps, but they can be performed at the same step.

Now, a second embodiment will be explained below with reference to FIGS. 6A to 6J and FIGS. 7A to 7I. The set of FIGS. 6A to 6J and the set of FIGS. 7A to 7I respectively show the sectional structure portions of the patterns shown in FIGS. 3A to 3I in manufacturing order, and they respectively correspond to the set of 4A to 4I and the set of FIGS. 5A to 5I.

First of all, element isolation is performed. Then, stacked gate structures, each comprising a first gate insulating film 3, a first polycrystalline silicon layer 4, a second gate insulating film 5, a second polycrystalline silicon layer 6, a first insulating film 7, and a third polycrystalline silicon layer 8, are formed within the element regions which are formed on a silicon substrate 1 by the element isolation. After that, those portions of each of strip shaped field oxide films 2 that are located at source forming regions are selectively removed by a reactive ion etching method so as to expose those portions of a silicon substrate 1 that are located at the source forming regions. Then, ion-implantation is performed, and insulating films 11 are formed on the side walls of each stacked gate structure (FIGS. 6A to 6D and FIGS. 7A to 7D). The second embodiment is the same as the first embodiment until this step.

Figure 6D:
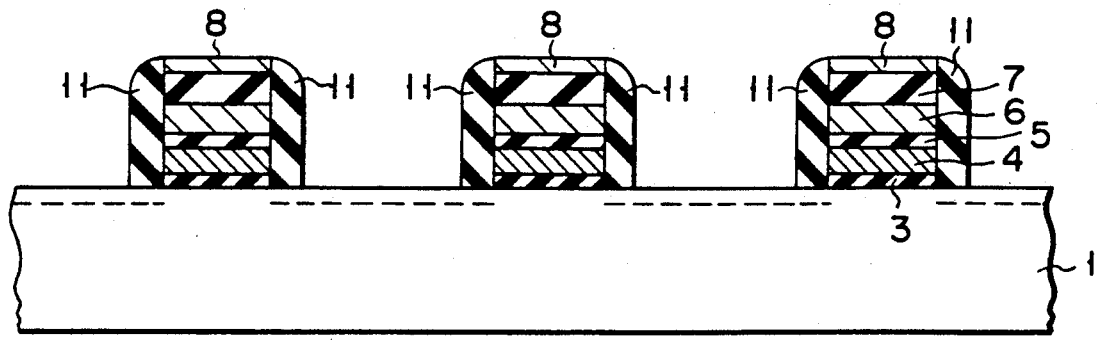
Figure 6E:
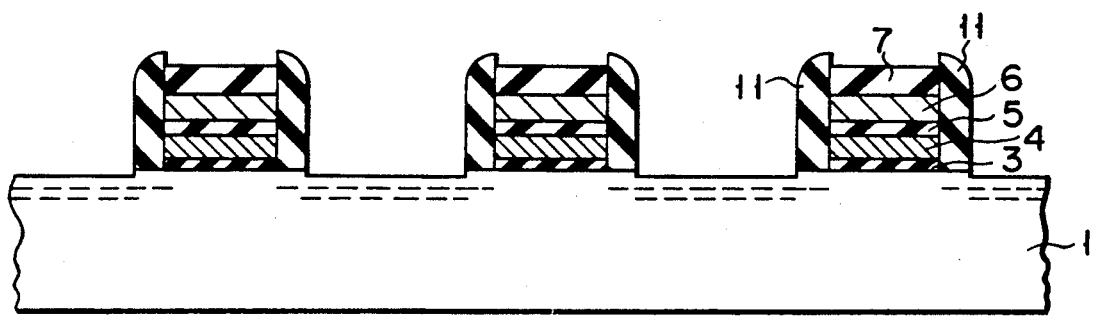
Figure 6F:
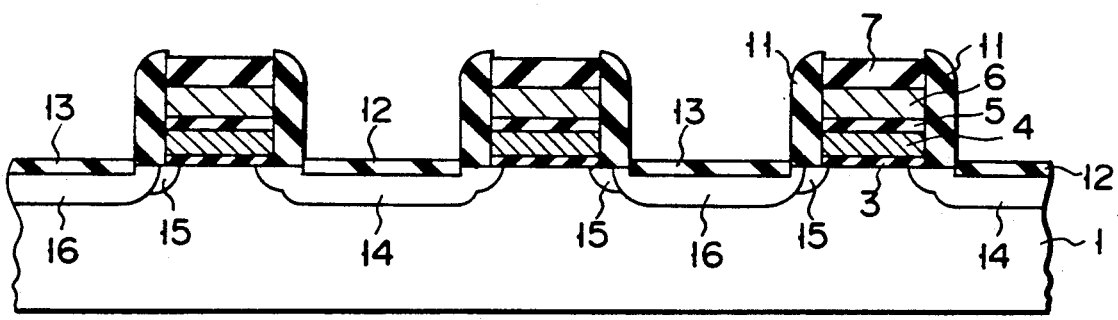
Figure 6G:
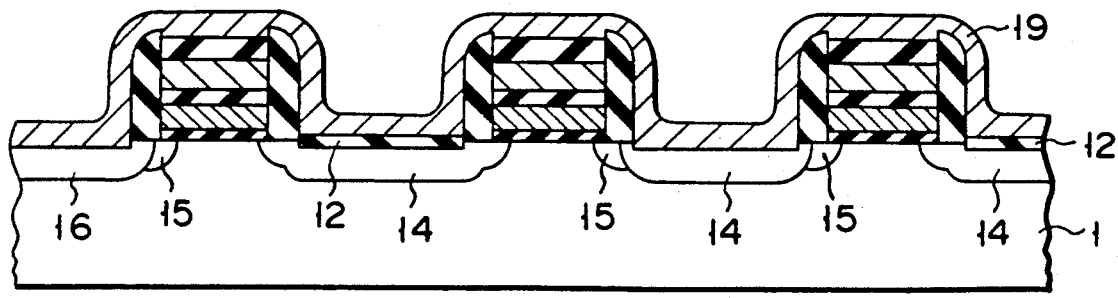

The third polycrystalline silicon layer 8 formed on the upper most layer of each stacked gate structure is removed by etching, and arsenic, for instance, is ion-implanted into the substrate 1 under a condition of 40 KeV in acceleration energy and $2 \times 10^{15}$ $cm^{-2}$ in dose, as shown in FIGS. 6E and 7E. When the polycrystalline silicon layers 8 are removed by etching, the surface of each source region and that of each drain region may be slightly etched, but diffusion layers having a good shape can be formed by the following ion-implantation.

Then, silicon oxide films 12 and 13 are respectively formed on the surface of each source forming region and the surface of each drain forming region of the substrate 1 by thermal oxidation. In this process, arsenic and phosphorous, which were implanted in the preceding ion-implantation steps, are diffused, and thus high concentration impurity regions 14 are formed for the source regions, and low concentration impurity regions 15 and high concentration impurity regions 16 are formed for the drain regions. In this manner, an LDD structure is formed.

Then, a fourth polycrystalline silicon layer 19 is formed and selectively removed to cover the drain-contact regions, an interlevel insulating film 21 is deposited and selectively removed to form contact holes, and a wiring pattern 24 is formed (FIGS. 6G to 6J and FIGS. 7G to 7I). These steps are the same as those of the first embodiment. The source-contact portions are formed in the same way. Then, passivation film and bonding pads are formed on the wiring pattern 24 to form an EPROM integrate circuit in accordance with the common MOS integrated circuit manufacturing method. These steps are also the same as those of the first embodiment.

The second embodiment also realizes that a self-align etching for the formation of the source regions and a self-align process for the formation of the drain-contact portions are easily performed with the use of two layers, i.e., the polycrystalline silicon layer 8 and the first insulating film 7.

Now, a third embodiment will be explained bellow with reference to FIGS. 8A to 8I and FIGS. 9A to 9H. The set of FIGS. 8A to 8I and the set of FIGS. 9A to 9H are sectional views corresponding to the set of FIGS. 4A to 4I and the set of FIGS. 5A to 5I, respectively.

The steps from element isolation till the formation of a stacked gate structure on each element region of a silicon substrate 1 (FIGS. 8A and 8B and FIGS. 9A and 9B) are the same as those of the first embodiment (FIGS. 4A and 4B and FIGS. 5A and 5B). Then, arsenic, for instance, is ion-implanted into drain forming regions under a condition of 40 KeV in acceleration energy and $5 \times 10^{14}$ $cm^{-2}$ in dose. Then, the CVD-$SiO_2$ film 11 is deposited on the resultant structure, and is selectively etched by a reactive ion etching method so that portions of the $SiO_2$ film 11 are left on the side walls of each gate electrode portion, as shown in FIGS. 8C and 9C.

Figure 8D:
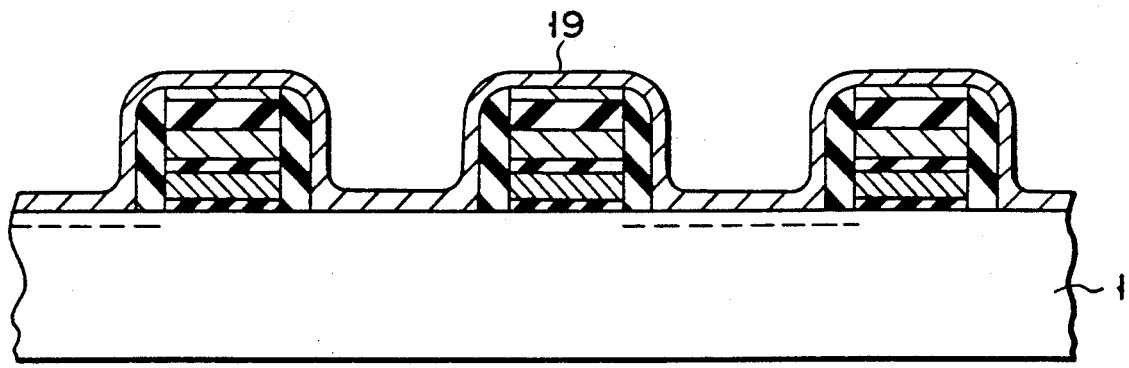
Figure 8E:
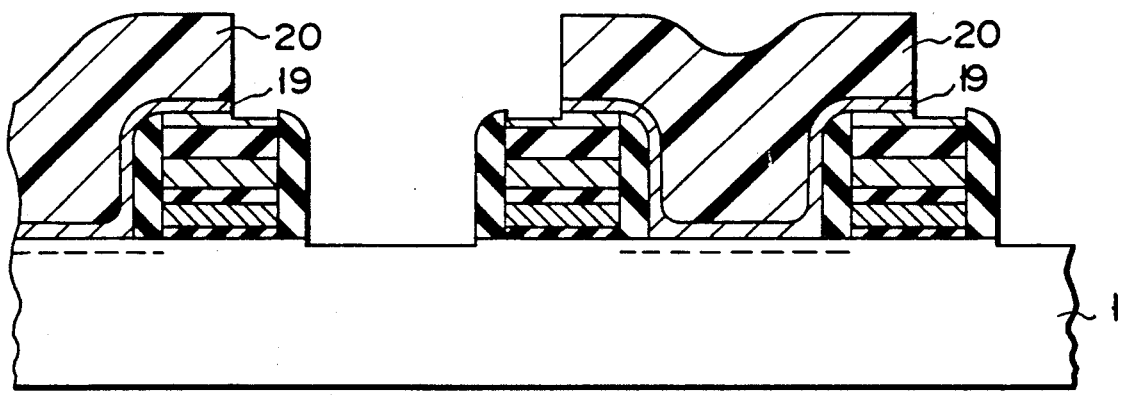

Then, a fourth polycrystalline silicon layer 19 having a thickness of about 100 Å is deposited on the resultant structure by a vapor phase growing method, as shown in FIGS. 8D and 9D. Impurities are doped into the fourth polycrystalline silicon layer 19. Then, the same patterns as those shown in FIG. 3G of the first embodiment are used with making use of the gate electrode portions as a reference for mask alignment to form resist patterns 20. The fourth polycrystalline silicon layer 19 is etched with making use of the resist patterns 20 (obliquely lined portion in FIG. 3G) as a mask. As a result, as shown in FIGS. 8E and 9E, each portion of the polycrystalline silicon layer 19 that covers both the surface of corresponding drain region and the surfaces of corresponding $SiO_2$ films attached on the facing side walls of the adjacent two gate electrodes with interposing the drain region in between. The polycrystalline silicon layer 8, or the upper most layer of each stacked gate structure, is also selectively etched for each cell.

Figure 8F:
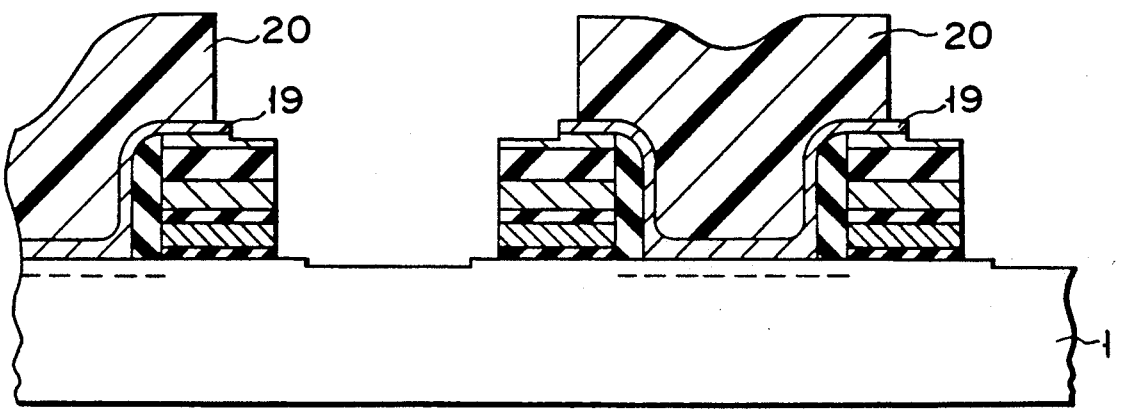

With the use of photoresist mask 10, which is formed with using the gate electrode portions as a reference of mask alignment, the strip shaped field oxide films 2 are selectively removed by a reactive ion etching method in the same way as the first embodiment to expose those portions of the silicon substrate 1 that are located at the source forming regions. Note that, while this etching process is performed, those SiO$_2$ films 11 that are located at the source regions are removed from the side walls of the stacked gate structures (FIGS. 8F and 9F).

Figure 8G:
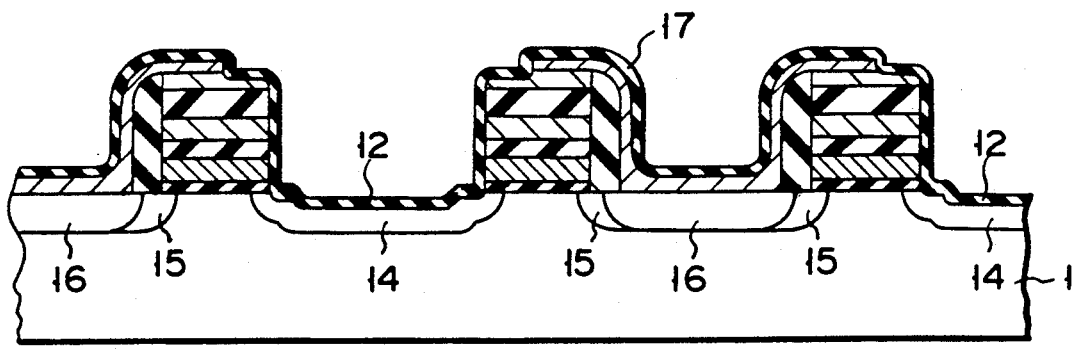

In the next step, arsenic, for instance, is ion-implanted into the exposed portions of the substrate 1 under a condition of 60 KeV in acceleration energy and $2 \times 10^{15}$ cm$^{-2}$ in dose. A silicon oxide film 12 is formed on the surface of each source region of the substrate 1 by thermal oxidation, and a thermal oxide film 17 is formed on the surface of each stacked gate structure and the surface of each polycrystalline silicon layer 19 at the same time. Note that arsenic and phosphorous, both having been ion-implanted when the ion-implantation was performed, are diffused in this step so as to form highly concentrated impurity regions 14 for the source regions and low concentrated impurity regions 15 and highly concentrated impurity regions 16 for the drain regions. In this way, an LDD structure is obtained (FIGS. 8G and 9G).

Figure 3H:
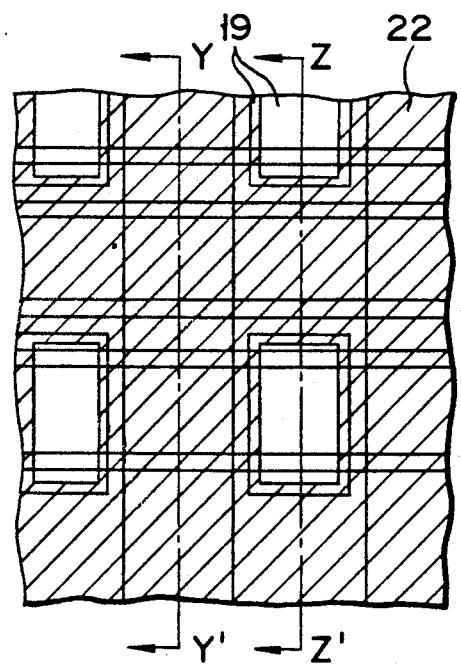
Figure 8H:
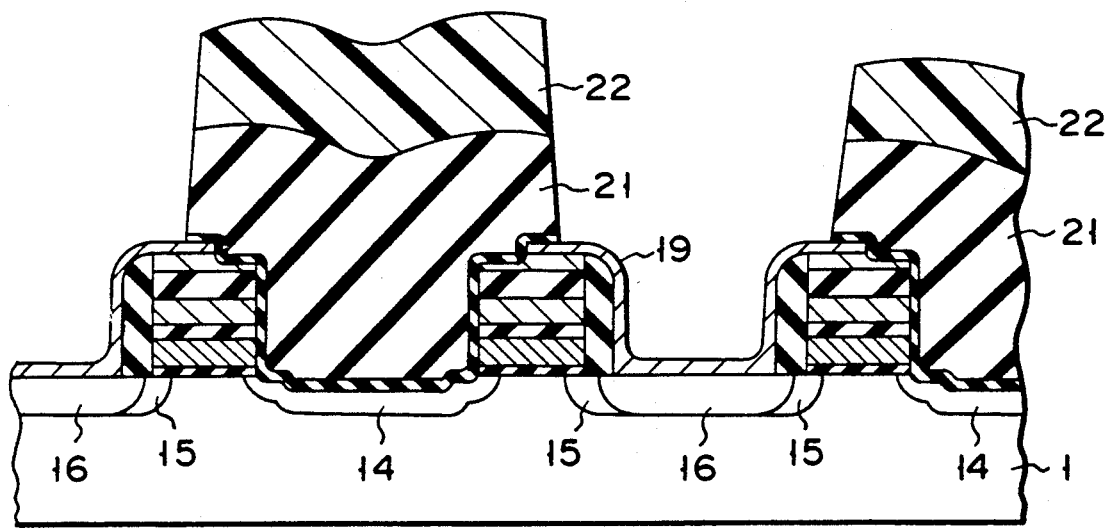
Figure 8I:
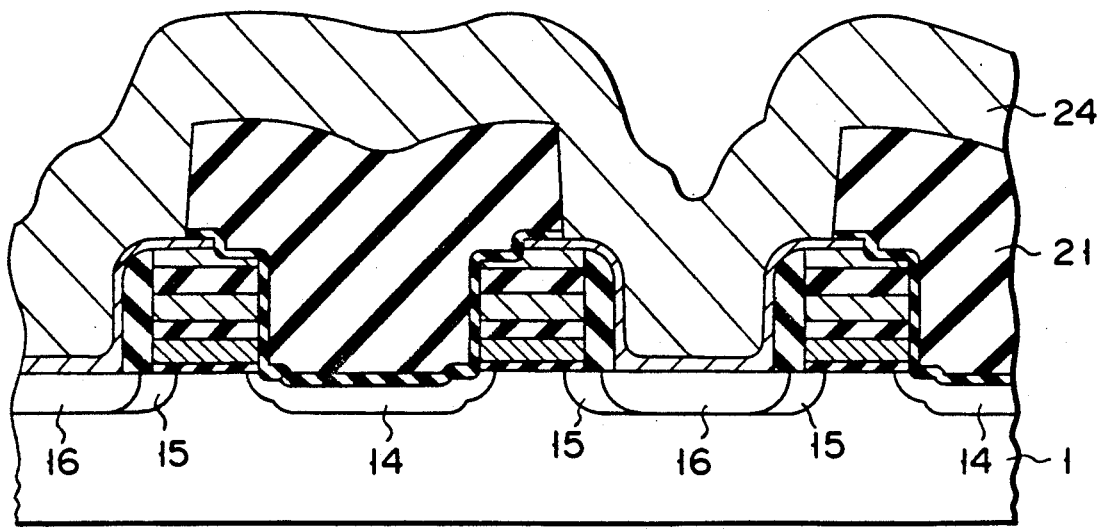

The CVD-SiO$_2$ film 21, from which interlevel insulating films are formed, is deposited on the resultant structure by, for instance, an LPCVD method. Then, a resist is made to have a pattern with the use of the gate electrode portions as a reference of mask alignment, so as to form a resist pattern 22, in the same way as what is shown in FIG. 3H of the first embodiment (obliquely lined portion in FIG. 3H). With using the resist pattern 22 as a mask and the remaining portions of the fourth polycrystalline silicon layer 19 as a stopper, the SiO$_2$ film 21 is etched as shown in FIGS. 8H and 9H. Then, an aluminum layer is deposited on the resultant structure by a sputtering method, and a resist is made to have a pattern with making the contact hole pattern (namely, the etching pattern of the SiO$_2$ film 21) as the alignment reference. With the use of the resist pattern as a mask, the aluminum layer is etched to form a wiring pattern 24 as shown in FIG. 8I.

Then, source-contact portions are also formed by a self-align contact forming method, and passivation film and bonding pads are formed on the wiring pattern 24 by the known MOS integrated circuit manufacturing method, thereby forming an EPROM, which is the same as the first and second embodiments.

The manufacturing method in the third embodiment also realizes that the self-align etching for the formation of the source regions and the self-align process for the formation of the drain-contact portions are simultaneously performed, since the two layer films, consisting of an insulating film and a polycrystalline silicon film, are formed on the two layer gate structure. Therefore, the margin for mask alignment can be made narrow without increasing manufacturing steps, and miniaturization and high integration can be easily accomplished.

Note that, in the third embodiment, the remaining portions of the polycrystalline silicon layer 8 that are located just under the corresponding portions of the polycrystalline silicon layer 19 are partially etched out when the polycrystalline silicon layer 19 is selectively etched in a step shown in FIGS. 8E and 9E. However, the partially etched out region of each layer 8 may be completely removed when the polycrystalline silicon layer 19 is selectively etched. In such a case, the exposed portion of each insulating film 7 is removed by such an etching step that each strip shaped field oxide film 2 is selectively removed to expose the source regions (FIGS. 8F and 9F), and thus each polycrystalline silicon layer 6, which is to be a control electrode, will be partly exposed. However, the exposed portion of each layer 6 is covered through the steps of thermal oxidation and the deposition of the interlevel insulating film 21, so that insulation ability will be maintained.

The explanation was given to the examples of a manufacturing method of two layer structure memory transistor cell, but it is needless to say that the present invention can be applied to a manufacture of a MOS transistor having a one layer gate electrode.

As explained above, the present invention realizes that the step of selective removal of the field oxide film and the step of self-align process for the formation of the drain-contact portions are simultaneously performed due to the fact that two layer film, consisting of the insulating film and the polycrystalline silicon film, is formed on the two layer gate structure. Therefore, margin for mask alignment can be made as narrow as possible without increasing manufacturing steps, resulting in the ease in miniaturization and high integration. In addition, the provision of the parallel arranged strip shaped field oxide films prevents the source forming regions from being narrow in width even when masks are misaligned. Therefore, there is no fear of degradation in element characteristics.

Therefore, the present invention makes it possible to obtain a method of manufacturing a semiconductor which can be highly integrated without causing degradation in element characteristics and complexity in manufacturing steps.

What is claimed is:

1. A semiconductor device manufacturing method comprising:

a step of forming strip shaped first insulating films separately extending in parallel with one another over a surface of a semiconductor substrate of a first conductivity type;

a step of forming over the semiconductor substrate and the strip shaped first insulating films a plurality of stacked gate structures extending in parallel with one another and in perpendicular to the strip shaped first insulating films, each stacked gate structure including a second insulating film, a floating gate electrode, a third insulating film, a control gate electrode, a fourth insulating film, and an etching stop film having a slower etching speed than the fourth insulating film;

a step of self-align removing those portions of each of the first insulating films that are located between any two of the adjacent stacked gate structures extending in parallel with one another and are located above source forming regions with using one end side of each of the stacked gate structures as a part of a mask, so as to expose those portions of the semiconductor substrate that are located at the source forming regions;

a step of self-align introducing impurities of a second conductivity type into each of the source forming regions using the one end side of each of the stacked gate structures as a mask;

a step of forming fifth insulating films on the side wall portions of each of the stacked gate structures;

a step of self-align introducing impurities of the second conductivity type into each of drain forming regions using the other end side of each of the stacked gate structures;

a step of self-align exposing those portions of the semiconductor substrate that are located at the drain forming regions with using as parts of a mask the fifth insulating films each formed on the other end side of each of the stacked gate structures;

a step of forming conductive layers which contact with surfaces of the exposed drain regions and cover at least those parts of the fifth insulating films that are laid on the walls located at the drain regions of any two adjacent stacked gate structures with corresponding one of the exposed drain regions being interposed between them;

a step of forming a sixth insulating film on the resultant structure;

a step of making contact holes by selectively removing the sixth insulating film with using the conductive layers as stoppers; and a step of forming wiring patterns on those portions of the sixth insulating films that include the contact holes.

2. The semiconductor device manufacturing method claimed in claim 1, in which the step of selectively removing those portions of the first insulating films that are located at the source forming regions is performed after the fifth insulating films are formed on the side walls of each stacked gate structure.

3. The semiconductor device manufacturing method claimed in claim 1, in which the formation of the drain regions includes a step of forming first impurity diffusion regions of a second conductivity type by self-align introducing impurities with making use of those side walls of each stacked gate structure that are located at the drain regions before forming the fifth insulating films, and a step of forming second impurity diffusion regions of the second conductivity type having higher impurity concentration than the first impurity diffusion regions by self-align introducing impurities with making use of those fifth insulating films that are located at the drain regions of each stacked gate structure after the fifth insulating films have been formed.

4. The semiconductor device manufacturing method claimed in claim 1, in which a polycrystalline silicon layer is deposited as the etching stop film.

5. The semiconductor device manufacturing method claimed in claim 1, in which a polycrystalline silicon layer is deposited as the conductive layer.

6. The semiconductor device manufacturing method claimed in claim 1, further comprising a step of removing the etching stop film after the fifth insulating film has been formed.

7. A semiconductor device manufacturing method comprising:

a step of forming strip shaped first insulating films separately extending in parallel with each other over a surface of a semiconductor substrate of a first conductivity type;

a step of forming over the semiconductor substrate and the strip shaped first insulating films a plurality of gate structures extending in parallel with each other and in perpendicular to the strip shaped first insulating films, each gate structure including a second insulating film, a gate electrode, a third insulating film, and an etching stop film having a slower etching speed than the third insulating film;

a step of self-align removing those portions of each of the first insulating films that are located between any two of the adjacent gate structures extending in parallel with each other and are located above source forming regions with using one end side of each of the gate structures as a part of a mask, so as to expose those portions of the semiconductor substrate that are located at the source forming regions;

a step of self-align introducing impurities of a second conductivity type into each of the source forming regions using the one end side of each of the gate structures as a mask;

a step of forming fourth insulating films on the side wall portions of each of the gate structures;

a step of self-align introducing impurities of the second conductivity type into each of drain forming regions using the other end side of each of the gate structures;

a step of self-align exposing those portions of the semiconductor substrate that are located at the drain forming regions with using as parts of a mask the fourth insulating films each formed on the other end side of each of the gate structures;

a step of forming conductive layers which contact with surfaces of the exposed drain regions and cover at least those parts of the fourth insulating films that are laid on the walls of the drain region side of each of any two adjacent gate structures with one of the exposed drain regions being interposed between them;

a step of forming fifth insulating film on the resultant structure;

a step of making contact holes by selectively removing the fifth insulating film with using the conductive films as stoppers; and a step of forming wiring patterns on those portions of the fifth insulating films that include the contact holes.

8. The semiconductor device manufacturing method claimed in claim 7, in which the step of selectively removing those portions of the first insulating films that are located at the source forming regions is performed after the fourth insulating films are formed on the side walls of each gate structure.

9. The semiconductor device manufacturing method claimed in claim 7, in which the formation of the drain regions includes a step of forming first impurity diffusion regions of a second conductivity type by self-align introducing impurities with making use of those side walls of each gate structure that are located at the drain regions before forming the fourth insulating films, and a step of forming second impurity diffusion regions of the second conductivity type having higher impurity concentration than the first impurity diffusion regions by self-align introducing impurities with making use of those fourth insulating films that are located at the drain regions of each gate structure after the fourth insulating films have been formed.

10. The semiconductor device manufacturing method claimed in claim 7, in which a polycrystalline silicon layer is deposited a the etching stop film.

11. The semiconductor device manufacturing method claimed in claim 7, in which a polycrystalline silicon layer is deposited as the conductive layer.

12. The semiconductor device manufacturing method claimed in claim 7, further comprising a step of removing the etching stop film after the fourth insulating film has been formed.

* * * * *